United States Patent
Habib

(10) Patent No.: US 10,782,014 B2
(45) Date of Patent: Sep. 22, 2020

(54) PLASMONIC ENERGY CONVERSION DEVICE FOR VAPOR GENERATION

(71) Applicant: Youssef M Habib, Lancaster, PA (US)

(72) Inventor: Youssef M Habib, Lancaster, PA (US)

(73) Assignee: Habib Technologies LLC, Lancaster, PA (US)

( * ) Notice: Subject to any disclaimer, the term of this patent is extended or adjusted under 35 U.S.C. 154(b) by 457 days.

(21) Appl. No.: 15/810,341

(22) Filed: Nov. 13, 2017

(65) Prior Publication Data

US 2018/0135850 A1 May 17, 2018

Related U.S. Application Data

(60) Provisional application No. 62/544,093, filed on Aug. 11, 2017, provisional application No. 62/420,759, filed on Nov. 11, 2016.

(51) Int. Cl.
| | | |
|---|---|---|
| *F22B 1/00* | (2006.01) | |
| *H01L 31/053* | (2014.01) | |
| *C02F 1/02* | (2006.01) | |
| *H01L 31/0352* | (2006.01) | |
| *G02B 5/00* | (2006.01) | |

(Continued)

(52) U.S. Cl.
CPC ............. *F22B 1/006* (2013.01); *C02F 1/02* (2013.01); *C02F 1/10* (2013.01); *C02F 1/14* (2013.01); *F24S 10/00* (2018.05); *F24S 70/10* (2018.05); *G02B 5/008* (2013.01); *H01L 31/035227* (2013.01); *H01L 31/053* (2014.12); *C02F 2201/009* (2013.01); *C02F 2305/08* (2013.01); *Y02E 10/40* (2013.01)

(58) Field of Classification Search
CPC . F22B 1/006; F24S 70/10; F24S 10/00; C02F 1/02; C02F 1/10; C02F 1/14; C02F 2201/009; C02F 2305/08; H01L 31/053; H01L 31/035227; Y02E 10/40
See application file for complete search history.

(56) References Cited

U.S. PATENT DOCUMENTS

| | | |
|---|---|---|
| 3,387,162 A | 6/1968 | Pieter et al. |
| 3,814,968 A | 6/1974 | Nathanson et al. |

(Continued)

FOREIGN PATENT DOCUMENTS

| | | | |
|---|---|---|---|
| DE | 102015117833 A1 * | 4/2017 | ......... B81C 1/00031 |
| EP | 1444718 A2 | 8/2004 | |

(Continued)

OTHER PUBLICATIONS

Zhou et al, "3D Self-Assembly of Aluminum Nanoparticles of Plasmon-Enhanced Solar Desalination", Nature Photonics, DOI: 10.1038/NPHOTON 2016.75, 2016 (Year: 2016).*

(Continued)

*Primary Examiner* — David E Smith
(74) *Attorney, Agent, or Firm* — Kohn & Associates, PLLC

(57) ABSTRACT

The present invention is related to using a plasmonic energy conversion device comprised of a non-permeable substrate and of a plurality of nanorods, either free standing or embedded in aluminum matrix, that utilizes plasmons to generate vapor from a fluid as a result of being exposed to radiation. Methods of manufacturing the plasmonic energy converter device are described.

66 Claims, 22 Drawing Sheets

(51) Int. Cl.
F24S 10/00 (2018.01)
F24S 70/10 (2018.01)
C02F 1/14 (2006.01)
C02F 1/10 (2006.01)

(56) References Cited

U.S. PATENT DOCUMENTS

| | | |
|---|---|---|
| 3,913,218 A | 10/1975 | Miller |
| 3,952,798 A | 4/1976 | Jacobson et al. |
| 4,012,770 A | 3/1977 | Pravda et al. |
| 4,015,280 A | 3/1977 | Matsushita et al. |
| 4,015,659 A | 4/1977 | Schladitz |
| 4,109,709 A | 8/1978 | Honda et al. |
| 4,208,577 A | 6/1980 | Wang |
| 4,209,705 A | 6/1980 | Washida et al. |
| 4,236,077 A | 11/1980 | Sonoda et al. |
| 4,274,479 A | 6/1981 | Eastman |
| 4,281,208 A | 7/1981 | Kuwano et al. |
| 4,591,717 A | 5/1986 | Scherber |
| 4,626,322 A | 12/1986 | Switzer |
| 4,633,034 A | 12/1986 | Nath et al. |
| 4,777,019 A | 10/1988 | Dandekar |
| 5,192,507 A | 3/1993 | Taylor et al. |
| 5,236,077 A | 8/1993 | Hoppmann et al. |
| 5,266,498 A | 11/1993 | Tarcha et al. |
| 5,277,960 A | 1/1994 | Tsuya et al. |
| 5,371,435 A | 12/1994 | Ohishi et al. |
| 5,445,972 A | 8/1995 | Tarcha et al. |
| 5,609,907 A | 3/1997 | Natan |
| 5,656,807 A | 8/1997 | Packard |
| 5,769,154 A | 6/1998 | Adkins et al. |
| 5,785,088 A | 7/1998 | Pai |
| 5,811,917 A | 9/1998 | Sekinger et al. |
| 5,861,324 A | 1/1999 | Ichinose et al. |
| 5,975,976 A | 11/1999 | Sekinger et al. |
| 6,056,044 A | 5/2000 | Benson et al. |
| 6,149,868 A | 11/2000 | Natan et al. |
| 6,219,137 B1 | 4/2001 | Vo-Dinh |
| 6,278,231 B1 | 8/2001 | Iwasaki et al. |
| 6,313,015 B1 | 11/2001 | Lee et al. |
| 6,325,904 B1 | 12/2001 | Peeters |
| 6,359,288 B1 | 3/2002 | Ying et al. |
| 6,384,519 B1 | 5/2002 | Beetz et al. |
| 6,399,177 B1 | 6/2002 | Fonash et al. |
| 6,427,765 B1 | 8/2002 | Han |
| 6,472,594 B1 | 10/2002 | Ichinose et al. |
| 6,483,009 B1 | 11/2002 | Poulsen |
| 6,483,099 B1 | 11/2002 | Yu et al. |
| 6,619,384 B2 | 9/2003 | Moon et al. |
| 6,620,997 B2 | 9/2003 | Kyoda et al. |
| 6,649,824 B1 | 11/2003 | Den et al. |
| 6,699,724 B1 | 3/2004 | West et al. |
| 6,706,961 B2 | 3/2004 | Shimizu et al. |
| 6,706,963 B2 | 3/2004 | Gaudiana et al. |
| 6,750,016 B2 | 6/2004 | Mirkin et al. |
| 6,812,399 B2 | 11/2004 | Shaheen et al. |
| 6,828,786 B2 | 12/2004 | Scherer et al. |
| 6,852,920 B2 | 2/2005 | Sager et al. |
| 6,858,158 B2 | 2/2005 | Chittibabu et al. |
| 6,861,263 B2 | 3/2005 | Natan |
| 6,872,645 B2 | 3/2005 | Duan et al. |
| 6,878,871 B2 | 4/2005 | Scher et al. |
| 6,882,051 B2 | 4/2005 | Majumdar et al. |
| 6,884,587 B2 | 4/2005 | Ford et al. |
| 6,889,755 B2 | 5/2005 | Zuo et al. |
| 6,890,764 B2 | 5/2005 | Chee et al. |
| 6,900,382 B2 | 5/2005 | Chittibabu et al. |
| 6,908,355 B2 | 6/2005 | Habib et al. |
| 6,913,075 B1 | 7/2005 | Knowles et al. |
| 6,913,713 B2 | 7/2005 | Chittibabu et al. |
| 6,919,119 B2 | 7/2005 | Kalkan et al. |
| 6,924,427 B2 | 8/2005 | Eckert et al. |
| 6,933,436 B2 | 8/2005 | Shaheen et al. |
| 6,936,761 B2 | 8/2005 | Pichler |
| 6,942,021 B2 | 9/2005 | Makino et al. |
| 6,945,317 B2 | 9/2005 | Garner et al. |
| 6,946,597 B2 | 9/2005 | Sager et al. |
| 6,949,206 B2 | 9/2005 | Whiteford et al. |
| 6,962,823 B2 | 11/2005 | Empedocles et al. |
| 6,969,897 B2 | 11/2005 | John |
| 6,983,791 B2 | 1/2006 | Hsu |
| 6,994,436 B2 | 2/2006 | Harris |
| 7,022,910 B2 | 4/2006 | Gaudiana et al. |
| 7,086,454 B1 | 8/2006 | Hsu |
| 7,109,581 B2 | 9/2006 | Dangelo et al. |
| 7,124,809 B2 | 10/2006 | Rosenfeld et al. |
| 7,124,810 B2 | 10/2006 | Lee et al. |
| 7,140,421 B2 | 11/2006 | Hsu |
| 7,144,830 B2 | 12/2006 | Hill et al. |
| 7,217,882 B2 | 5/2007 | Walukiewicz et al. |
| 7,267,859 B1 | 9/2007 | Rabin et al. |
| 7,288,419 B2 | 10/2007 | Naya |
| 7,713,849 B2 | 5/2010 | Habib et al. |
| 9,517,357 B2* | 12/2016 | Omenetto ................ A61F 7/03 |
| 9,545,458 B2* | 1/2017 | Halas ..................... F24S 90/00 |
| 9,831,362 B2* | 11/2017 | Fan ..................... H01L 31/02366 |
| 10,393,885 B2* | 8/2019 | Alvine ................... C23C 14/024 |
| 2001/0032666 A1 | 10/2001 | Jenson et al. |
| 2002/0079493 A1 | 6/2002 | Morishita |
| 2002/0142480 A1 | 10/2002 | Natan |
| 2002/0167254 A1 | 11/2002 | Craig et al. |
| 2003/0022169 A1 | 1/2003 | Mirkin et al. |
| 2003/0027195 A1 | 2/2003 | Ford et al. |
| 2003/0042406 A1 | 3/2003 | Charbon |
| 2003/0146433 A1 | 8/2003 | Cantwell et al. |
| 2003/0158474 A1 | 8/2003 | Scherer et al. |
| 2003/0175773 A1 | 9/2003 | Chee et al. |
| 2003/0222579 A1 | 12/2003 | Habib et al. |
| 2003/0231304 A1 | 12/2003 | Chan et al. |
| 2004/0023046 A1 | 2/2004 | Schlottig et al. |
| 2004/0063214 A1 | 4/2004 | Berlin et al. |
| 2004/0109666 A1 | 6/2004 | Kim |
| 2004/0118448 A1 | 6/2004 | Scher et al. |
| 2004/0144985 A1 | 7/2004 | Zhang et al. |
| 2004/0213307 A1 | 10/2004 | Lieber et al. |
| 2005/0009224 A1 | 1/2005 | Yang et al. |
| 2005/0051304 A1 | 3/2005 | Makino et al. |
| 2005/0077184 A1 | 4/2005 | Lazarenko-Manevich et al. |
| 2005/0087332 A1 | 4/2005 | Umeo et al. |
| 2005/0098204 A1 | 5/2005 | Roscheisen et al. |
| 2005/0105085 A1 | 5/2005 | Naya |
| 2005/0112048 A1 | 5/2005 | Tsakalakos et al. |
| 2005/0116336 A1 | 6/2005 | Chopra et al. |
| 2005/0121068 A1 | 6/2005 | Sager et al. |
| 2005/0126766 A1 | 6/2005 | Lee et al. |
| 2005/0136608 A1 | 6/2005 | Mosley |
| 2005/0206314 A1 | 9/2005 | Habib et al. |
| 2006/0016580 A1 | 1/2006 | Lee et al. |
| 2006/0038990 A1 | 2/2006 | Habib et al. |
| 2006/0054881 A1 | 3/2006 | Li et al. |
| 2006/0131002 A1 | 6/2006 | Mochizuki et al. |
| 2006/0151153 A1 | 7/2006 | Chen |
| 2006/0162907 A1 | 7/2006 | Wu et al. |
| 2006/0207647 A1 | 9/2006 | Tsakalakos et al. |
| 2006/0207750 A1 | 9/2006 | Chang et al. |
| 2006/0213646 A1 | 9/2006 | Hsu |
| 2006/0255452 A1 | 11/2006 | Wang et al. |
| 2006/0289351 A1 | 12/2006 | Xiao et al. |
| 2007/0111368 A1 | 5/2007 | Zhang et al. |
| 2007/0224399 A1 | 9/2007 | Rabin et al. |
| 2007/0252136 A1 | 11/2007 | Lieber et al. |
| 2007/0256562 A1 | 11/2007 | Routkevitch et al. |
| 2007/0286945 A1 | 12/2007 | Lahnor et al. |
| 2008/0047604 A1 | 2/2008 | Korevaar et al. |
| 2009/0050204 A1 | 2/2009 | Habib |
| 2009/0068553 A1 | 3/2009 | Firsich |
| 2009/0214956 A1 | 8/2009 | Prieto et al. |
| 2009/0266411 A1 | 10/2009 | Habib et al. |
| 2010/0078055 A1 | 4/2010 | Vidu et al. |
| 2010/0126567 A1* | 5/2010 | Kaufman ................ G02B 5/008 136/252 |
| 2010/0193768 A1 | 8/2010 | Habib |
| 2010/0200199 A1 | 8/2010 | Habib et al. |
| 2011/0045230 A1 | 2/2011 | Habib et al. |

(56) References Cited

U.S. PATENT DOCUMENTS

| | | | |
|---|---|---|---|
| 2011/0189510 A1 | 8/2011 | Caracciolo et al. | |
| 2012/0034524 A1 | 2/2012 | Caracciolo et al. | |
| 2013/0026441 A1* | 1/2013 | White | G02B 5/201 257/9 |
| 2015/0017433 A1* | 1/2015 | Alisafaee | H01L 31/035218 428/338 |
| 2015/0288318 A1 | 10/2015 | Guler et al. | |
| 2015/0353385 A1 | 12/2015 | Wang et al. | |
| 2016/0258069 A1* | 9/2016 | Nesbitt | C25B 1/003 |
| 2017/0222724 A1* | 8/2017 | Chang | H04B 10/50 |

FOREIGN PATENT DOCUMENTS

| | | | |
|---|---|---|---|
| EP | 1444718 A4 | 11/2005 | |
| EP | 1996887 A2 | 12/2008 | |
| JP | 2012524402 A | 10/2012 | |
| WO | 1998013857 A1 | 4/1998 | |
| WO | 2003043045 A2 | 5/2003 | |
| WO | 0346265 | 6/2003 | |
| WO | 03046265 A2 | 6/2003 | |
| WO | 2003046265 A3 | 11/2003 | |
| WO | 2003043045 A3 | 1/2004 | |
| WO | 2004099068 A2 | 11/2004 | |
| WO | 20040990688 A2 | 11/2004 | |
| WO | 2006138671 A2 | 12/2006 | |
| WO | 2008016725 A2 | 2/2008 | |
| WO | 2008016725 A3 | 8/2008 | |
| WO | 2010121272 A1 | 10/2010 | |
| WO | 2011094642 A1 | 8/2011 | |

OTHER PUBLICATIONS

Wang, Zhen and Chang, Sukbok From Organic Letters, 15(8), 1990-1993; (2013).

Waterworld.com, www.waterworld.com/articles/wwi/print/volume-26/issue-2/regulars/creative-finance/mobile-water-systems-a-compelling-solution-to.html (2015).

Westwater et al. "Growth of Silicon Nanowires via Gold/Silane Vapor-Liquid-SolidReaction" Journal of Vacuum Society Technology, 1997, B 15(3).

Wu, Template Synthesis of Highly Ordered Mesostructured Nanowires and Nanowire Arrays. American Chemical Society, Web Release Oct. 14, 2004. fig. 1 p. 2338 col. 1; entire doc.

Xu, H. et al. "Electromagnetic Contributions to Single-Molecule Sensitivity in Surface-Enhanced Raman Scattering." Physical Review, 62, 4318-4323 (2000).

Xu, Wanli and Flake, John C., "Composite Silicon Nanowire Anodes for SecondaryLithium-Ion Cells" Journal of the Electrochemical Society. ECS: Aug. 26, 2009.

Y. Peng, H. Zhang, S. Pan, and H. Li, Jour. Appl. Phys. 87, 7405 (2000) and A. Jansson, G. Thornell, and S. Johansson, J. Electrochem Soc, 147, 1810 (2000).

Y. Peng, H. Zhang, S. Pan, and H. Li, Jour. Appl. Phys. 87, 7405 (2000).

Yang, Huabin et al, "Amorphous Si Film Anode Coupled with LiCoO2Cathode in Li-Ion Cell" Journal of Power Sources. Elsevier B.V.: Jul. 3, 2007.

Yao, J.L. et al., "A Complementary Study of Surface-Enhanced Raman Scattering and MetalNanorod Arrays," Pure Aool. Chem., 72, 221-228, (2000).

Yonezu, I. et al, Sanyo Electric Co., Ltd., Abs. 58, IMLB 12 Meeting. ECS:2004.

Yonzon, C.R. et al., "A Glucose Biosensor Based on Surface-Enhanced Raman Scattering: Improved Partition Layer, Temporal Stability, Reversibility, and Resistance to Serum Protein Interference," Anal. Chem., 76, 78-85, (2004).

Yu et al. "Surface electronic surface of plasma-treated indium tin oxides." Applied Physics Letters, vol. 78 (17) p. 2595-2597 Apr. 2001.

Yu G, Gao J, J.C. Hummelen, F. Wudl, AJ. Heeger, Science 270: 1789-1791 (1995).

Yu, D. et al, Physica E 9.2001.

Z. Wang, P. Tao, Y, Lui, H. Xu, Q. Ye, H. Hu, C. Song, Z. CHen, W. Shang and T. Deng. Nature Scientific Reports, 4:6246, 1-8 (2014).

Zech, N, Podlaha, E.J., and Landolt, D., "Anomalous Codeposition of Iron Group Metals," 146,2886-2891 (1999).

Zhao W-B et al. "Photochemical synthesis of CdSe and PbSe nanowire arrays on a porous aluminum oxide template" Scripta Materialia. vol. 50, No. 8, Apr. 1, 2004.

Lew et al. "Growth Characteristics of Silicon Nanowires Synthesized by Vapor-Liquid-SolidGrowth in Nanoporous Alumina Templates" Journal of Crystal Growth, 2003, CRYS: 11806.

Lew et al. "Structural and Electrical Properties of Trimethylboron-doped SiliconNanowires" Applied Physics Letters, 2004, vol. 85, No. 15.

Lew et al. "Template-directed Vapor-Liquid-Solid Growth of Silicon Nanowires" Journal of Vacuum Society Technology, 2002, B 20(1 ).

Li, X. et al., "Mercaptoacetic Acid-Capped Silver Nanoparticles Colloid: Formations, MorohoIOQV, and SERS Activity," Langmuir, 19, 4285-4290, (2003).

Lim, "A novel structure, high conversion efficiency p-SiC/graded p-SiC/i-si/n-Si/meal substrate type amorphous silicon solar cell" Jul. 1984 , J. Appl. Phys., (2) pp. 538-551.

Liu, P. et al, Journal of Power Sources.2006.

M. Tabatabaei, A. Sangar, N. Kazemi-Zanjani, P. Torchio, A. Merlen, F. Lagugne-Labarthet, J. Phys. Chem. C, 117, 14778-14786 (2003).

M.D. Malinsky, K.L. Kelly, G.C. Schatz, G.C. and R.P. Yan Duyne. D. Am. Chem. SOc., 123, 1471-1482 (2001).

M.L. Brongersma, N.J. Halas and P. Noridander. Nature Nanotechnology, 10, 25-34 (2015).

Martin C R et al. "Nanomaterials: A Membrane-Based Synthetic Approach" Science, American Association for Advancement of Science, vol. 266, No. 1961, Dec. 23, 1994.

Mengke et al. "Synthesis of Ordered Si Nanowire Arrays in Porous AnodicAluminum Oxide Templates" Chinese Science Bulletin, 2001, vol. 46, No. 21.

Menon. Nanoarrays Synthesized from Porous Alumnia, Dekker Encyclopedia of Nanoscience and Nanotechnology, Published Apr. 13, 2004, abstract.

Method of making superhydrophobic/superoleophilic paints, epoxies, and composites U.S. Pat. No. 9,334,404 (issued May 10, 2016 ORNL).

N. J. Gerein and J. A. Haber, Journal of Physical Chemistry B, 109, 17372-17384, (2005).

N.J. Hogan, A.S. Urban, C. Ayala-Orozco, A. Pimpinelli, P. Norlander and N.J. Halas. NanoLetters, 14 4640-4645 (2014).

Nie, S. and Emory, S., "Probing Single Molecules and Single Nanoparticles by Surface-Enhanced Raman Scattering," Science, 275, 1102-1106, ( 1997).

O. Jessenky, F. Muller, and U. Gosele, Applied Physics Letters 72, 1173-1175 (1998).

O. Neumann, A. D. Neumann, E. Silva, C. Ayala-Orozco, S. Tian, P. Norlander, and N. J. Halas, Nanoparticle-Mediated, Light-Induced, Phase Separations, Nano Lett., 15, (7880-7885).

O. Neumann, A. S. Urban, J. Day, S. Lai, P. Norlander, and N. J. Halas, Solar Vapor Generation Enabled by Nanoparticles, ACS Nano, 7, 42-48 (2013).

P. Berto, M.S.A. Mohamed, H. Rigneault, and G. Baffou. Phys. Rev. B. 90, 035439-1-12 (2014).

P. Narang, R. Sundararaman, and H.A. Atwater, DOI: 10.1515/nanoph-2016-007.

R. C. Denomme, K. Iyer, M. Kreder, B. SMith and P.M. Nieva. J. Micro/Nano Lithography, 12(3), 031106 (2013).

Routkevitch D et al. "Electrochemical Fabrication of CDS Nanowire Arrays in PorousAnodic Aluminum Oxide Templates" Journal of Physical Chemistry, col. 100, Jan. 1, 1996.

S, Gno, M. Saito, and H. Asoh,Electrochimea Acta, 51 , 827-833 [2005]).

(56) References Cited

OTHER PUBLICATIONS

S.A. Majer, Plasmonics: Fundamentals and Applications; Springer: New York, (2007).
S.Z. Chu, K. Wada, S. Inoue, M. Isogai, Y. Katsuta, and A. Yasumori, Journal Electrochemcial Society, 153, B384-B391 (2006).
Saito, Y. et al., "A Simple Method for the Preparation of Silver Surfaces for Efficient SERS," Langmuir, 18, 2959-2961, (2002).
Sasaki, K.Y. and Talbot, J.B., "Electrodeposition of Iron-Group Metals and Binary Alloys from Sulfate Baths," J. Electrochem.Soc., 145, 981-990 (1998).
SBI Energy, World Desalination Technologies and Components Market, Aug. 2011.
Shafer-Peltier, K. et al., "Toward a Glucose Biosensor Based on Surface-Enhanced RamanScattering," J. Am. Chem. Soc., 125, 588-593, (2003).
Sharma et al. A Novel Low Temperature Synthesis Method for Semiconductor Nanowires. Materials Research Society Spring Meeting, Apr. 17, 2001, p. 9.
Shipway, A, Katz, E., and Willner, I., "Nanoparticle Arrays on Surfaces for Electronic, Optical, and Sensor Applications," ChemPhysChem, 1, 18-52, (2000).
Solar Thermal Technologies:Applications and Global Markets, BCC Research EGY137A, (2016).
Soumahoro, T., "Surface-Enhanced Raman Scattering Substrates: Highly Sensitive SensorsIS. tv1 .I for the Detection of Adsorbate Molecules," NNIN REU Research Accomplishments, 128-129, (2004).
Tao, A. et al., "Langmuir-Blodgett Silver Nanowire Monolayers for Molecular Sensing UsingSurface-Enhanced Raman Spectroscopy," Nano Letters, 3, 1229-1233, (2003).
Teki, Ranganath et al, "Nanostructured Silicon Anodes for Lithium-IonRechargeable Batteries" Small Journal. Wiley InterScience: 2009.
The Water Project, www.waterproject.org, (2015).
Tian, Z., Ren, B., and Wu, D., "Surface-Enhanced Raman Scattering: From Noble to TransitionMetals and from Rough Surfaces to Ordered Nanostructures," 106, 9463-9483, (2002).
U. Guler, J. C. Ndukaife, G. V. Naik, A.G.A. Nnanna, A.V. Kildishev, W.M. Shalaev, and A. Boltasseva. NanoLetters, 13, 6078-6083 (2013).
U.S. Energy Information Administration Electricity Explained,https://www.eia.gov/energyexplained/index.cfm?page=electricity_in_the_united_states. (2016).
United Nations Water, www.unwater.org (2015).
Usov, et al. "Analysis of the local indium composition in ultra thing inGaN layers" Semicond. Sci. Tech. Mar. 22, 2007 p. 528-531.
Van Duyne, RP. et al., "Nanoparticle Optics: Sensing with Nanoparticle Arrays and Single Nanoparticles," Proceedings of SPIE, 5223, 197-207 (2003).
Vidu, U.S. Appl No. 60/710,097, filed Aug. 22, 2005.
Vo-Dinh, T. et al., "Surface-Enhanced Raman Scattering (SERS) Method and Instrumentation for Genomics and Biomedical Analysis," Journal of Raman Spectroscopy, 30, 785-793, (1999).
Vo-Dinh, T., "Biosensors, Nanosensors, and Biochips: Frontiers in Environmental and Medical Diagnostics," The 1st International Symposium on Micro and Nano Technoloqv, 1-6, (2004).
W. Lee, K. Nielsch, and U. Gosele, Nanotechnology, 18, 475713 (2007).
W. Wang, P.N. Kumta, J. Power Sources 172 (2007) 650.
W. Weiss, F. Mauthner, and M. Spork-Dur Solar Heat Worldwide (Solar Heating and Cooling Programme, International EnergyAgency) (2012).
Wacaser et al. "Growth System, Structure, and Doping ofAluminum-seeded Epitaxial Silicon Nanowires" 2009.
Goa, Minmin; Kang, Peh; Connor, Nuo and Ho, Ghum Wei. Plasmonic photothermic directed broadband sunlight harnessing for seawater catalysis and desalination. Energy Environ, Sci. 2016, 9, 3151.
Neumann, Ora; Urban, Alexander S.; Day, Jared; Lal, Surbhi; Nordlander, Peter' and Halas, Naomi J. Solar Vapor Generation enabled by Nanoparticles. American Chemical Society. vol. 7, No. 1, 42-29 (2013).
Dilts et al. "Fabrication and Electrical Characterization of Silicon NanowireArrays" Materials Research Society, 2005, vol. 832.
Dmitri Routkevitch et al. "Nonlithographic Nano-Wire Arrays: Fabrication, Physics, andDevice Applications" IEEE Transactions on Electron Devices. vol. 43, No. 10, Oct. 1, 1996.
Dresselhaus et al. "Investigation ofLow-Dimensional Thermoelectrics" Nonlithographic & Lithographic Methods for Nanofabrication:Symposium Proceedings. Technomic Pub Co: 200.
Dresselhaus. "Nanostructures and Energy Conversion" Proceedings of 2003 Rohsenow Symposium on Future Trends of Heat Transfer. MIT, Cambridge, MA: May 16, 2003.
Efrima, S. and Bronk, B.V., "Silver Colloids Impregnating or Coating Bacteria," J. PhysicalChem. B, 102, 5947-5950, (1998).
Electrochemical Society, Inc.; D. Yu, Y, Xing, Q. Hang, H. Yan, J. Xu, Z. Xi, and S. Feng, Physica E 9 [2001] 305-309.
Ensling, D. et al, Materials Chemistry, 19, 82-88 (2009).
Evans, S. D.; Sharma, R.; Ulman, A. Langmuir 7, 156-61(1991).
F. Keller, M. Hunter, and D. Robinson, Journal of the Electrochemical Society, 411-419 (1953).
Felidji, N. et al., "Controlling the Optical Response of Regular Arrays of Gold Particles forSurface-Enhanced Raman Scattering," Physical Review B, 65, 075419, (2002).
Felidji, N. et al.. "Gold Particle Interaction in Regular Arrays Probed by Surface EnhancedRaman Scatterinq," J. Chem.Phvs., 120, 7141-7146, (2004).
W. Xu and J.C. Flake, J. Eleetroehem. Soc, 157(1) A41-A45 [2010].
G. Baffou, J. Polleux, H. Rigneault, and S. Monneret. Super-Heating and Micro-Bubble Generation around Plasmonic Nanoparticles under CW Illumination, J. Phys. Chem, 118 4890-4898 (2014).
G. E. Thompson and G. C. Wood, Nature 290 230-232 (1981).
G. Ni, G. Li, S. V. Boriskina, H. Li, W. Yang, T. Zhang, and G. Chen Steam generation under one sun enabled by a floating structurewith thermal concentration, Nature Energy, DOI: 10.1038.NENERGY. 2016.126.
G. Ni, N. Milkovic, H. Ghasemi, X. Huang, S. V. Boriskina, C. Lin, J. Wang, Y. Xu, M. Rahman, T. Zhang, and G. Chen, Volumetric solar heating of nanofluids for direct vapor generation, Nano Energy, 17, 290-301 (2015).
Graetz, Jason, "Highly Reversible Lithium Storage in NanostructuredSilicon" Electrochemical and Solid-State Letters. ECS: Feb. 7, 2003.
Gruberger and E. Gileadi, Electrochemical Acta, 31,1531 (1986).
Grubisha, D. et al., "Femtomolar Detection of Prostate-Specific Antigen: An Immunoassay Based on Surface-Enhanced Raman Scattering and Immunogold Labels," Analytical Chemistry, 75, 5936-5943, (2003).
H. Ghasemi, G. Ni, A. M. Marconnet, J. Loomis, S. Yerci, N. Milijovic, and G. Chen, Solar steam generation by heat localization, Nature Commun. 5:4449 DOI: 10.1038/ncomms5449 (2014).
H. Li, X. Huang, L. Chen, G. Zhou, Z. Zhang, D. Yu, Y. J. Mo, N, Pei, Solid-State Ionics 135 (2000) 181.
H. Yang, P. Fu H. Zhang, Y. Song, Z. Zhou, M. Wu, L. Huang, and G. Xu, Journal of Power Sources 174 (2007) 533-537.
Haes, A. and VanDuyne, R., "A Nanoscale Optical Biosensor: Sensitivity and Selectivity of an Approach Based on the Localized Surface Plasmon Resonance Spectroscopy of Triangular Silver Nanoparticles," J. Am. Chem. Soc., 124, 10596-10604, (2002).
Haynes, C. and Van Duyne, R., "Plasmon-Sampled Surface-Enhanced Raman ExcitationSpectroscopy," J. Phys. Chem. B, 107, 7426-7433, (2003).
http://www.allresist.com/photorestist-other-resists-uv-patterning-of-pmma-resist/.
http://www.exceliteplas.com/polycarbonate-vs-acrylic-yellowing-which-one-degrades-faster/.
Huang, J., Li, C., and Liang, Y., "FT-SERS Studies on Molecular Recognition Capabilities ofMonolayers of Novel Nucleolipid Amphiphiles," Langmuir, 16, 3937-3940, (2000).
I.S. Baral, A.J. Green, M.Y. Livshits, A. O. Gorov, and H.H Richardson. ACS Nano, 8, 1439-1448 (2014).

(56) References Cited

OTHER PUBLICATIONS

J. Gruberger and E. Gileadi, Electrochemical Acta, 31, 1531 (1986).
J. Lee, W. Kim, J. Kim, S. Lim, and S, Lee. Journal of Power Sources 176 [2008] 353-358.
J. Perez-Juste, I. Pastoriza-Santos, L.M. Liz-Marzan, P. Mulvaney. Coordination Chemistry Reviews, 249, 1870-1901 :2005).
J. Vossen, W. Kern, "Thin Film Processes", Academic Press, 1978.
J.C. Hulteen and R.P. Van Duyne J. Vac. Sci. Technolo. A, 13(3), 1553-1558 (1995).
Jeong et al. "Synthesis of Silicon Nanotubes on Porous Alumina UsingMolecular Beam Epitaxy" Advanced Materials, 2003, vol. 15, No. 14.
Jeong, D., Zhang, Y., and Moskvits, M., "Polarized Surface Enhanced Raman Scattering from Aligned Silver Nanowire Rafts," J. Phys. Chem. B, 108, 12724-12728, (2004).
Jiang, J. et al., "Single Molecule Raman Spectroscopy at the Junctions of Large Ag Nanocrystals," J. Phys. Chem. B, 107, 9964-9972, (2003).
K. Chen, B.B. Rajeeva, Z. Wu, M. Rukavina, T.D. Dao, S. Ishii, M. Aono, T. nagao, and Y. Zherng. ACS Nano, In Press (2015).
K. Nakayama, K. Tanabe, and H. Atwater, Appl. Phys. Lett., 93, 121904-1 (2008).
K. Shimuzu, K. Kobayaski, G. E. Thompson, and G. C. Wood, Phiolosophical Mag. A, 66, 643 (1991).
Kayes "Radial PN Junction Nanorod Solar Cells:Device Physics Principles and Routes to Fabrication In Silicon", Jan. 2005, Photovoltaic Specialists Conference, 2005. Conference Record of the Thirty-first IEEE, pp. 55-58.
Kneipp, K. et al., "Near-Infrared Surface-Enhanced Raman Scattering (NIR SERS) on Colloidal Silver and Gold," Applied Spectroscopy, 48, 951-955, (1994).
Kneipp, K. et al., "Surface-Enhanced Raman Scattering (SERS)—A New Tool for Single Molecule Detection and Identification," BioimaQinQ, 6, 104-110, (1998).
Kneipp, K. et al., "Ultrasensitive Chemical Analysis by Raman Spectroscopy," Chem. Rev., 99,2957-2975, (1999).
Kneipp, K. et al., "Single Molecule Detection Using Surface-Enhanced Raman Scattering(SERS)," Physical Review Letters, 78, 1667-1670, (1997).
L. F. Cut Y. Yang, C. M. Hsu, and Y, Cui, NanoLetters, 9, 3370-3374 (2009).
L. Zhou, Y. Tan, D. Ji, B. Zhu, P. Zhang, J. Xu, Q. Gan, Z. Yu, and J. Zhu, Self-assembly of highly efficient broadband plasmonic absorbers for solar steam generation, Sci. Adv., 2, e1501227 (2016).
Laranjeira, "Fabrication of high quality silicon-polyaninilne heterojunctions", May 2002, Applied Surface Science vol. 190, pp. 390-394.
Lee et al. Spherical Silicon/Graphite/Carbon Composites as Anode Material forLithium-Ion Batteries Journal of Power Sources. Elsevier B.V.: Jun. 28, 2007.
Lee, W. Kim, J. Kim, S. Lim, and S. Lee. Journal of Power Sources 176 [2008] 353-358; L.F. Cui, R. Ruffo, C. . Chan, and Y. Cui, NanoLetters, 9, 491-495 [2009].
Lee, Yong Min et al, "SEI Layer Formation on Amorphous Si Thin Electrode during Precycling" Journal of the Electrochemical Society. ECS: Nov. 14, 2006.
U.S. Appl. No. 11/466,411, filed Apr. 10, 2010, Vidu.
Sauciuc, M. Mochizuki, K. Mashiko, Y. Saito and T. Nguyen, Proceedings of the Sixteenth IEEE Semi-Therm Symposium, Anaheim, Calif., USA, 2000 pp. 27-32.
A. Lalisse, G. Tessier, J. Plain, and G. Baffou, Quantifying the Efficiency of Plasmonic Materials for Near-Field Enhancement and Photothermal Conversion, J. Phys. Chem. 119, 25518-25528 (2015).
C. Chin, MIT Journal of Young Reeserchers, www.jyi.org/issue/fabrication-of-metallic-nanoparticle-arrays (2007).
C. F. Bohren, How can a particle absorb more than the light incident on it? Am. J. Phys. 51 323-327 (1983).
D. Linden and T. Reddy. Handbook of Batteries [3rd edition] of 372 Ah/kg.
D. S. Sholl and R. P. Lively, Seven chemical separations to change the world, Nature, 532, 435-437 (2016).

IEA-ETSAP and IRENA Tech. Brief 112, Water Desalination Using Renewable Energy, Mar. (2012).
Introduction to Heat Pipes, G. P. Paterson, John Wiley & Sons, New York, 1994.
L. A. Weinstein, J. Loomis, B. Bhatai, D. M. Bierman, E.N. Wang, and G. Chen, Concentrating Solar Power, Chem. Rev. 115 1279712838 (2015).
L. F. Cui, R. Ruffo, C. K. Chan, and Y, Cui, NanoLetters, 9, 491-495 (2009).
L. Zhou, Y. Tan, J. Wang, W. Xu, Y. Yuan, W. Cai, S. Zhu, and J. Zhu, 3D self-assembly of aluminum nanoparticles for plasmonenhanced solar desalination Nature Photon.DOI: 10.1038/NPHOTON.2016. 75 (2016).
L.F. Cui, Y. Yang, CM. Hsu, and Y. Cui, NanoLetters, 9, 3370-3374 [2009]).
N. J. Hogan, A. S. Urban, C. Ayala-Orozco, A. Pimpinelli, P. Norlander, and N. J. Halas Nanoparticles heat through light localization, NanoLetters, 14, 4640-4645 (2014).
Spangler, C. W.; McCoy, R. K.; Dembek, A. A.; Sapochak, L. S.; Gates, B. D. J. Chem, Soc. Perkin Trans. 1151-154. (1989).
W, Xu and J.C. Flake, J. Electrochem. Soc. 157( 1) A41-A45 (2010).
Yan, y.; Huang, L.-B., Zhou, Y.; Han, S.-T.; Zhou, L; Sun, Q.; Zhuang, J.; Peng, H.; Yan, H.; Roy, V. A. L. ACS Appl. Mater. Interfaces 2015, 7, 23464-23471.
Younezu, H. Tarui, S. Yoshimura, S. Fujitani, and T. Nohm, SANYO Electric Co, Ltd., Abs. 58, IMLB12 Matting, © 2004.
Z. Chu, K, Wada, S. Inoue, M. Isogai, Y. Katsuta, and A. Yasumori, J. Electrochem. Soc. 153, B384-6391 [2006].
W. Wang, P.N. Rumta, J. Power Sources 172 (2007) 650.
A. Jansson, G. Thornell, and S. Johansson, J. Electrochem Soc., 147, 1810 (2000).
A. Kosiorek, W. kandulski, H. Glaczynske, and M. Giersig. Small, 1, 439-444 (2005).
A. Manjavacas, J.G. Liu, V. Kulkami and P. Norlander, ACS Nano, 8, 7630-7638 (2014).
A. Polman, ACS Nano, 8, 15-18 (2013).
A. Van Hoonacker, and P. Englebienne. Current Nanoscience, 2, 359-371 (2006).
A.J. Haes, S. Zou, G.C. Schatz, Van Duyne, R.P. J. Phys. CHem. B, 108, 109-116 (2004).
A.O. Govorov and H.H. Richardson. NanoToday, 2, 30-38 (2007).
Aquaneers, Inc. Proposal to the U.S. Department of Energy SBIR/STTR FY 2017Phase II Release 2. Photothermal Solar Cell.
Aroca, R. et al., "Silver Nanowire Layer-by-Layer Films as Substrates for Surface-Enhanced Raman Scattering," Anal. Chem., 77, 378-382, (2005).
B. Wiley, T. Herricks, Y. Sun, Y. Zia. NanoLetters, 4, 1733-1739 (2004).
Bae et al. "VLS Growth of Si Nanocones Using Ga and Al Catalysts" Journal ofCrystal Growth, 2008, p. 4407-4411.
BCC Research, Seawater and Brackish Water Desalination,MST052D Mar. 2016.
Bjerneld, E. et al., "Single-Molecule Surface-Enhanced Raman and Fluorescence CorrelationSpectroscopy of Horseradish Peroxidase," J. Phys. Chem. B, 106, 1213-1218, (2002).
Bogart et al. "Diameter-controlled Synthesis of Silicon Nanowires UsingNanoporous Alumina Membranes" Advanced Materials, 2005, vol. 17, No. 1.
Bowden et al. "Rapid & Accurate Determination of Series Resistance & Fill Factor Losses in Industrial Silicon Solar Cells" School of Elec & Comp. Eng'g_ Georgia Inst. of Tech.
C. Chin, MIT Journal of Young Researchers, www.jyi.org/issue/fabrication-of-metallic-nanoparticle-arrays (2007).
C. Clavero. Nature Photonics, 8, 95-103 (2014).
C. Clavero. Plasmon-induced hot-electron generation at nanoparticle/metal-oxide interfaces for photovoltaic and photocatalytic devices, Nature Photonics, 8, 95-103 (2014).
Cao, Y.C. et al., "Raman Dye-Labeled Nanoparticle Probes for Proteins," J. Am. Chem. Soc.,125, 14676-14677, (2003).
Çaykaraa, T.; Güvenb, O. Polymer Degradation and Stability, 65, 225-229 (1999).
Chan, C. et al, Nature Nanotechnology, 3, 31-35 (2008).

(56) References Cited

OTHER PUBLICATIONS

Cheng G S et al. "Large-scale synthesis of single crystalline gallium nitride nanowires" Applied Physics Letters, AIP, vol. 75, No. 16, Oct. 18, 1999.
Civale et al. "Aspects of Silicon Nanowire Synthesis by Aluminum CatalyzedVapor-Liquid-Solid Mechanism" Laboratory of ECTM, DIMES, Delft University of Technology.
Colom, X.; Garcia, T.; Suñol, J. J.; Saurina, J.; Carrasco, F. Journal of Non-Crystalline Solids 287, 308-312 (2001).
Cui, Li-Feng et al, "Carbon-Silicon Core-Shell Nanowires as High Capacity Electrode for Lithium Ion Batteries" NanoLetters. ACS: Washington, DC, May 27, 2009.
Cui, Li-Feng et al, "Crystalline-Amorphous Core-Shell Silicon Nanowires for High Capacity and High Current Battery Electrodes" NanoLetters. ACS: Wash., DC, Dec. 1, 2008.
D. Al-Mawlawi, C Z. Liu, and Martin Moskovits Journal of the Materials Research Society, 9, 1014-1018 (1994).
D. Ma, S. Li and C. Liang, Corrison Science, 51, 713 (2007).
D. Talbot, MIT Technology Review, 118, 49 (2015).
D. Yu, Y. Xing, Q. Hang, H. Van. J. Xu, Z. Xi, and S, Feng, Physica E 9 (2001) 305-309.
A. Josiorek, W. kandulski, H. Glaczynske, and M. Giersig. Small 1, 439-444 (2005).
Bogart, "Diameter Controlled Synthesis of Silicon Nanowires Using Nanoporous Alumina Membranes", Jan. 2005, AdvancedMaterials, vol. 17 No. 1, pp. 114-117.
Cheng G S et al: "Large-scale synthesis of single crystalline gallium nitride nanowires" Applied Physics Letters, AIP, American Institute of Physics, Melville, NY, US LNKD—DOI:10.1063/1.125046, vol. 75, No. 16, Oct. 18, 1999 (Oct. 18, 1999), pp. 2455-2457, XP012023784 ISSN: 0003-6951.
Dmitri Routkevitch et al: "Nonlithographic Nano-Wire Arrays: Fabrication, Physics, and Device Applications" IEEE Transactions on Electron Devices, IEEE Service Center, Pisacataway, NJ, US, vol. 43, No. 10, Oct. 1, 1996 (Oct. 1, 1996), XP011015942 ISSN: 0018-9383.
Dresselhaus et al. "Investigation of Low-Dimensional Thermoelectrics" Nonlithographic &Lithographic Methods for Nanofabrication:Symposium Proceedings. Technomic Pub Co: 2001.
F. Keller, M. Hunter, and D. Robinson, Journal of the Electrochemcial Society, 411-419 (1953).
F. Keller, M. S. Hunter, and D. L. Robinson, Journal of the Electrochemical Society 100, 411-419 (1953).
Martin C R et al: "Nanomaterials: A Membrane-Based Synthetic Approach" Science, American Association for the Advancement of Science, Washington, DC; US LNKD—DOI:10.1126/SCIENCE.266.5193.1961, vol. 266, No. 1961, (Dec. 23, 1994), pp. 1961-1966, XP001167310 ISSN: 0036-8075.
Menon. Nanoarrays Synthesized from Porous Alumina, Dekker Encyclopedia of Nanoscience and Nanotechnology, Published Apr. 13, 2004, abstract.
Routkevitch D et al: "Electrochemical Fabrication of CDS Nanowire Arrays in Porous Anodic Aluminum Oxide Templates" Journal of Physical Chemistry, American Chemical Society, US LNKD—DOI:10.1021/JP952910M, vol. 100, Jan. 1, 1996 (Jan. 1, 1996), pp. 14037-14047, XP001167308 ISSN: 0022-3654.
S.Z. Chu, K. Wada, S. Inoue, M. Isogai, Y. Katsuta, and A. Yasumori, Journal Electrochemical Society, 153, B384-B391 (2006).
SBI Market Research. World Desalination Technologies and Components Markets, 2011.
Wu, Templated Synthesis of Highly Ordered Mesostructured Nanowires and Nanowire Arrays. American Chemical Society, Web Release Oct. 14, 2004. fig 1; p. 2338 col. 1; entire doc.
Z. Wang, P. Tao, Y. Lui H. Xu, Q. Ye, H. Hu, C. Song, Z. Chen, W. Shang, and T. Deng. Nature Scientific Reports, 4:6246, 1-8 (3014).
Zhao W-B et al: "Photochemical synthesis of CdSe and PbSe nanowire arrays on a porous aluminum oxide template" Scripta Materialia, Elsevier, Amsterdam, NL LNKD—DOI:10.1016/J.SCRIPTAMAT.2004.01.017, vol. 50, No. 8, Apr. 1, 2004 (Apr. 1, 2004), pp. 1169-1173, XP004491334 ISSN: 1359-6462.
W. Xu and J.C. Flake, J. Eiectrochem. Soc, 157(1 ) A41-A45 [2010]).

* cited by examiner

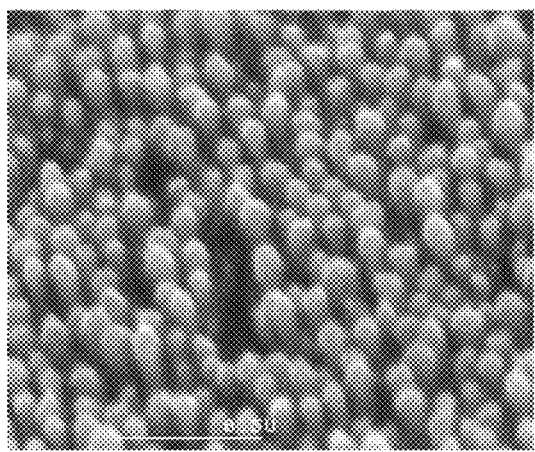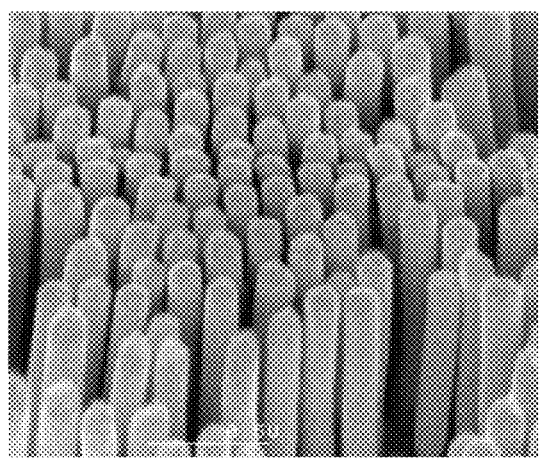
Fig. 20A                    Fig. 20B

PLASMONIC ENERGY CONVERSION DEVICE FOR VAPOR GENERATION

PRIORITY CLAIM

This is a utility patent application. This application claims priority as a non-provisional continuation of U.S. Pat. App. No. 62/544,093, filed on Aug. 11, 2017, incorporated herein by reference. This application claims priority as a non-provisional continuation to U.S. Patent Application No. 62/420,759, filed on Nov. 11, 2016, incorporated herein by reference.

This invention was made with U.S. Government support under Grant No. DE-SC0015924 awarded by the U.S. Department of Energy, Office of Science, and the U.S. Government has certain rights in this invention.

FIELD OF INVENTION

The present invention is in the general field of nano-dimensioned materials. More specifically, techniques for the manufacture of a plasmonically active rods attached to carrier materials (substrates) are disclosed. The invention can be used to absorb radiant energy (light) and convert it into thermal energy (heat).

BACKGROUND

Plasmonically active rods that are electrically conductive can efficiently couple light into collective electron excitations (plasmons) contained within sub-wavelength material dimensions resulting in localized nano-scale direct energy transfer phenomena not observed in macroscopic material samples. The engineering of functional nanostructures using plasmonic materials holds great promise for use in many energy intensive industrial applications, in particular for the capture and conversion of solar energy. Novel, cost-effective plasmonically active device formats could find widespread adoption when applied to industrial processes where traditional heating techniques and sources can be replaced or supplanted with localized optical energy to heat (photothermal) conversion.

SUMMARY OF THE INVENTION

The present invention is use of a plasmonically active device consisting of a plurality of nanostructures engineered on, and attached to, the surface(s) of carrier (substrate) materials for generating a vapor from a fluid. The fabrication method of the device described herein allows for the large scale and large area continuous production of materials containing plasmonically active rods and their subsequent incorporation into devices that can drive energy intensive industrial applications such as steam generation, distillation, desalination, photo-catalysis, and more using optical radiation energy. More particularly, the present invention consists of arrays of plasmonic rod-like elements engineered on the surfaces of continuous substrates such as ribbons, foils, threads, fibers, or other carriers that are produced using electrochemical techniques. The plasmonic nano-rods may be vertically aligned. The methods disclosed for the present invention are applied to the manufacture of a plasmonic energy conversion device, including an embodiment that has specific photothermal energy conversion response properties tailored for particular applications and device designs. The invention can be used for radiant-to-thermal energy conversion and solar energy harvesting.

BRIEF DESCRIPTION OF THE DRAWINGS

FIG. 20A shows SEM images of low aspect gold plasmonic rod arrays.

FIG. 20B shows SEM images of high aspect gold plasmonic rod arrays.

DETAILED DESCRIPTION OF THE INVENTION (EMBODIMENTS)

Referring now to the invention in more detail, it is a plasmonic energy conversion device and use thereof, where the device is comprised of a plurality of conducting rod-like structures attached to a conducting substrate with the structures specifically designed and intended to interact with optical energy (light) via energy exchange. The device consists of vertically aligned arrays of nano scale rods which are attached to the surface of a carrier, or substrate material. The rods have a cylindrical shape with one radial end of the cylinder attached to the substrate such that a multiplicity of rods arrayed on a surface herein can appear in one embodiment as a "bristled" surface. The bristled surface has a substantially greater surface area than the substrate on which it is fabricated. The rods can vary in geometry from short, quasi-hemispherical low-aspect structures to elongated, high-aspect bristles with these geometrical variations affecting the optical response of the rods and providing a means to manipulate and control the optical characteristics of the device. The rods are plasmonic in, being that they are made of a material and possess a geometry that supports a Plasmon, Surface Plasmon, or Plasmon Resonance; being an electromagnetic interaction between the rod and incident radiant energy (light) where the light is absorbed by the rod(s) and the optical energy converted into a Plasmon.

Figure 1:
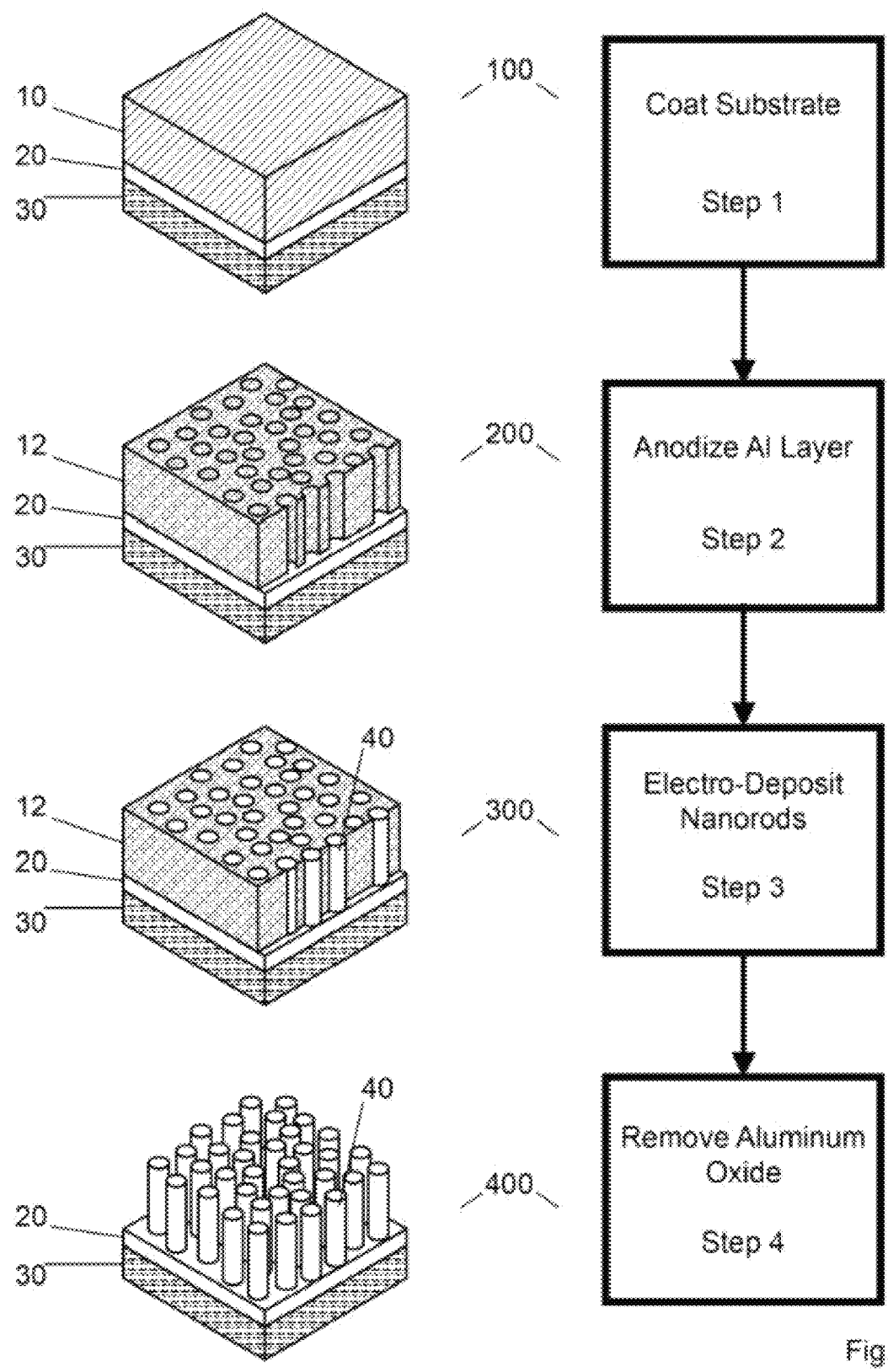
FIG. 1 is a four step process schematic showing how plasmonic rod arrays are fabricated on a planar coated substrate.

Referring now to FIG. 1, which shows a four step diagrammatical representation outlining the basic process used to fabricate the invention and showing two embodiments of the invention. Step 1 of the invention fabrication process 100, shows the starting (precursor) material consisting of a substrate 30 that is coated with a thin conducting layer 20 followed by a layer of process material, which can be aluminum (Al) 10. The precursor material 100 that is shown in FIG. 1 is subsequently treated using electrochemical processes to produce the present plasmonic energy conversion device, with the conducting layer 20 is used as an electrode in the next two steps of the fabrication process. Still referring to FIG. 1, in Step 2 (200), the process material (Al) layer 10 from Step 1 (100) is anodized in an electrolytic bath and completely converted into a nanoporous Anodic Aluminum Oxide (AAO) layer 12 as shown in 200. The nanopores in the AAO layer 12 penetrate fully through from the top surface to the conducting layer 20 below. The nanoporous AAO layer 12 is then used as a template for the formation of plasmonic rods. In Step 3 (300) a plasmonic material has been deposited into the pores of the nanoporous AAO template 12 to form plasmonic rods 40. The rods 40 are in robust electrical and physical contact (attached) with the underlying conductive layer 20, which in turn is attached to the substrate 30. Referring to FIG. 1, Step 3 shows a version of the present invention 300 that can be utilized with the rods 40 remaining encased in the nanoporous AAO 12, as the AAO layer is largely transparent allowing light to interact with the rods embedded within. Alternatively, the nanoporous AAO layer 12 can be removed by chemical etch, as shown in Step 4 (400) that reveals an array of free-standing, vertically-aligned plasmonic rods attached to the underlying conductive layer 20, which itself is attached to the substrate material 30. The free-standing plasmonic rod array 400 is the second embodiment of the present invention provided in FIG. 1. It should be noted that the drawings are not to scale.

Continuing with FIG. 1 and Step 1 of the invention fabrication process 100, the layer of process material, which can be aluminum (Al) 10, can also be made of other metals that are amenable to anodization and the formation of a nanoporous oxide layer such as Titanium (Ti), Magnesium (Mg), Niobium (Nb), Tin (Sn), or Cobalt (Co). Similarly, the process layer 10 can be made of a material amenable to chemical conversion into a nanoporous sulfide, such as Iron (Fe) Cobalt (Co) Nickel (Ni) or nanoporous carbides such as Tungsten (W) or Molybdenum (Mo).

Figure 2A:
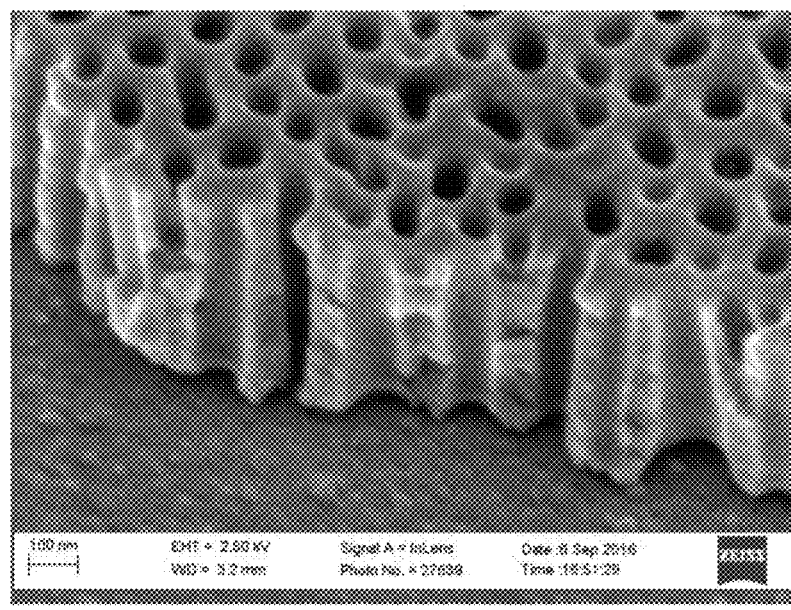
FIG. 2A shows Scanning Electron Microscope (SEM) images of a nanoporous Anodic Aluminum Oxide (AAO) layer.
Figure 2B:
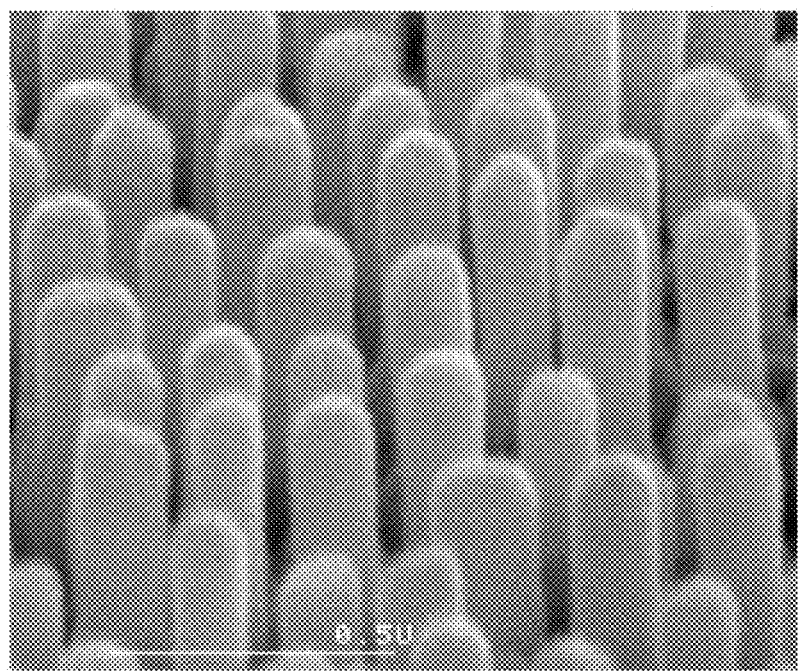
FIG. 2B shows a gold plasmonic rod array.

Referring now to FIG. 2, which shows two Scanning Electron Microscope (SEM) images of the plasmonic energy conversion device presented schematically in FIG. 1 at different steps in the fabrication process. Specifically, in FIG. 2, the upper image 210 corresponds to Step 2 (200) in the invention process schematic shown in FIG. 1 and shows a cross-sectional image of a layer of nanoporous AAO fabricated on a silver coated glass substrate 210. Image 210 in FIG. 2 shows a well defined nanoporous AAO template with the pores open through to the underlying conductive layer and having the following properties: a pore density of $4.3 \times 10^9 / cm^2$, an average pore depth of 325 nm, diameters of 98 nm, and average center-to-center spacing of 156 nm. The thickness of the AAO layer in the present invention is largely determined by the thickness of the precursor Al layer. Still referring to FIG. 2, the lower SEM image 410 corresponds to the Step 4 (400) schematic in FIG. 1 and shows an array of gold plasmonic rods fabricated on an Indium Tin Oxide (ITO) coated glass substrate. Image 410 shows the present invention after removal of the AAO template. The vertically aligned rods 410 have an areal density of $8 \times 10^8 / cm^2$, and are approximately 875 nm in average length with 135 nm diameters. In other embodiments, the plasmonic rods have an average diameter of 120 nm and a density of $\sim 2.1 \times 10^{10} / cm^2$.

Figure 3A:
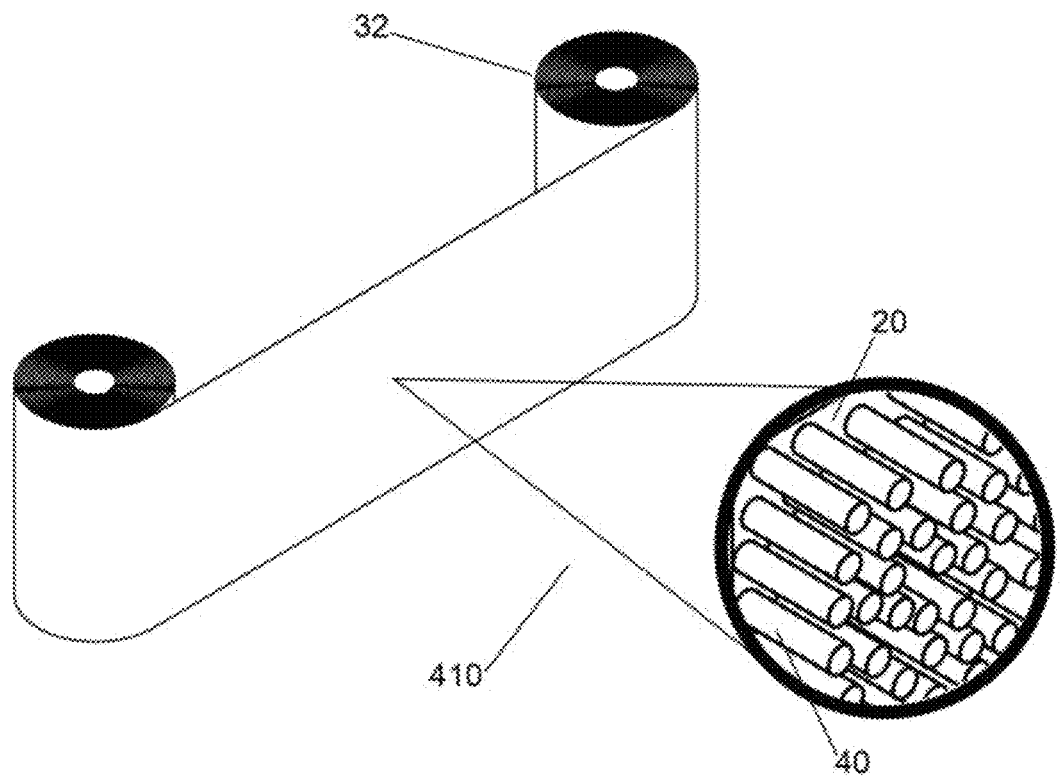
FIG. 3A shows a top view of a plasmonic rod arrays fabricated on the surface of a continuous flexible substrate material.
Figure 3B:
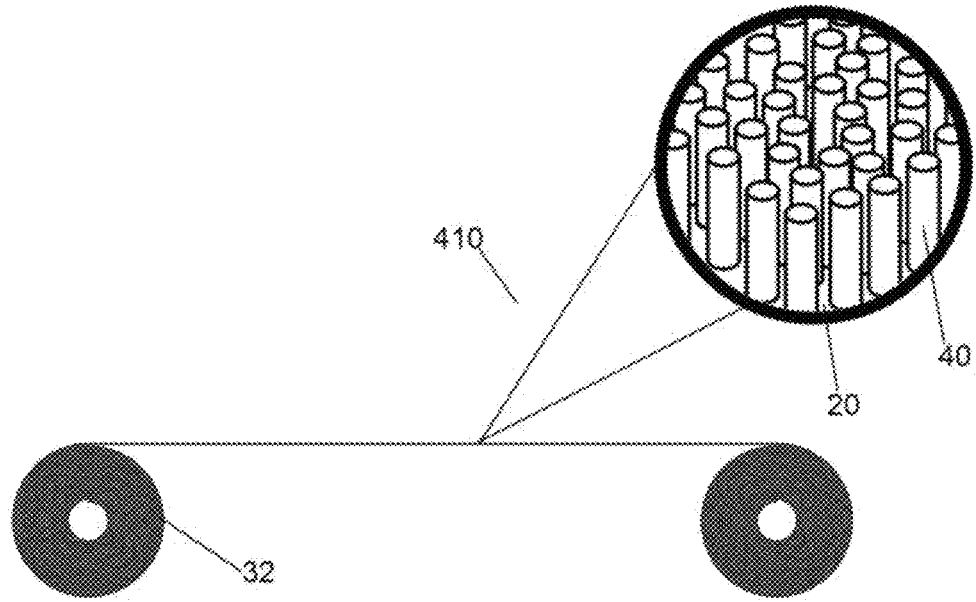
FIG. 3B shows a side view of the continuous material in a reel-to-reel format.

Regarding the present invention, FIG. 3 shows an embodiment of the plasmonic energy conversion device in which arrays of rods are fabricated in a reel-to-reel configuration using a flexible and continuous substrate material that is suitable for continuous manufacturing techniques; such as flexible glass, polymer layers, metal foils, threads or fibers produced in a rolled, spooled, reel, or ribbon format. The polymer may be polyimide (Kapton™) or polyvinyl fluoride (Tedlar™). Referring in more detail to FIG. 3 that shows two views of the plasmonic energy conversion device invention with plasmonic rod arrays fabricated on the surface of a reel-to-reel carrier 410, with the upper schematic showing a vertical reel orientation and the lower one showing the reels oriented horizontally, and, in either orientation the substrate 32 is spooled with rods 40 attached to the surface and oriented at the normal (perpendicular) relative to the substrate surface. In particular, FIG. 3 shows a plasmonic ribbon format 410 with a spooled carrier material 32 coated with a conductive layer 20 and plasmonic rod arrays 40 as shown in the zoomed (inset) views. The width of the ribbon can be from millimeters to many meters and it can have most any length. The rods 40 and conductive layer 20 are in robust electrical and mechanical contact with the underlying spooled continuous substrate material 32 to which they are physically attached. While the rods are shown in FIG. 3 on one surface of the substrate 32, they could readily be fabricated on two (both) sides of the planar, ribbon geometry presented herein. They may also be fabricated around the exterior circumference of a thread or fiber, or on more complex geometrical surfaces.

Figure 4:
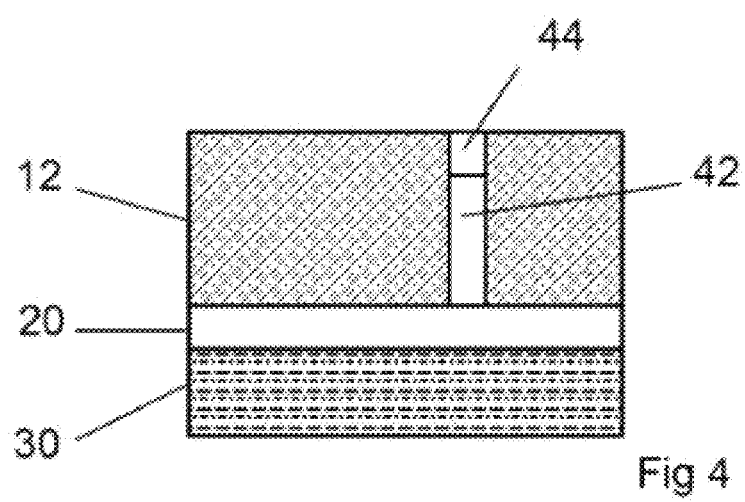
FIG. 4 shows a side view of the present plasmonic energy conversion invention in a planar configuration.
Figure 5:
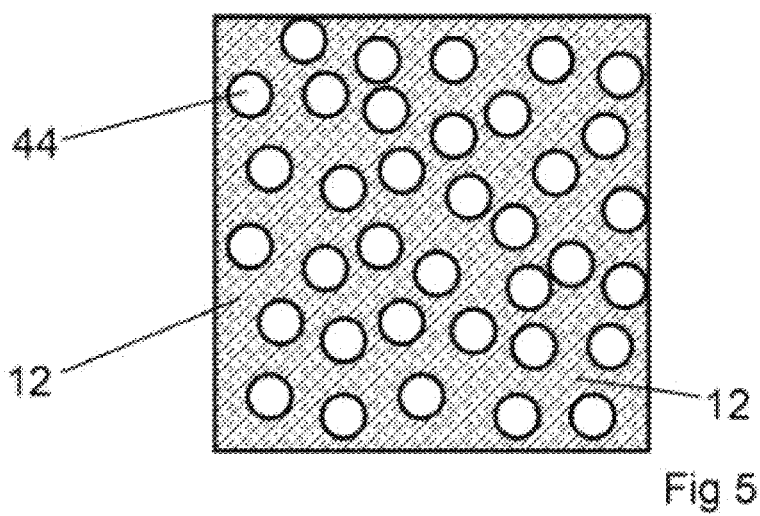
FIG. 5 shows a top down view of the present plasmonic energy conversion invention in a planar configuration.
Figure 6:
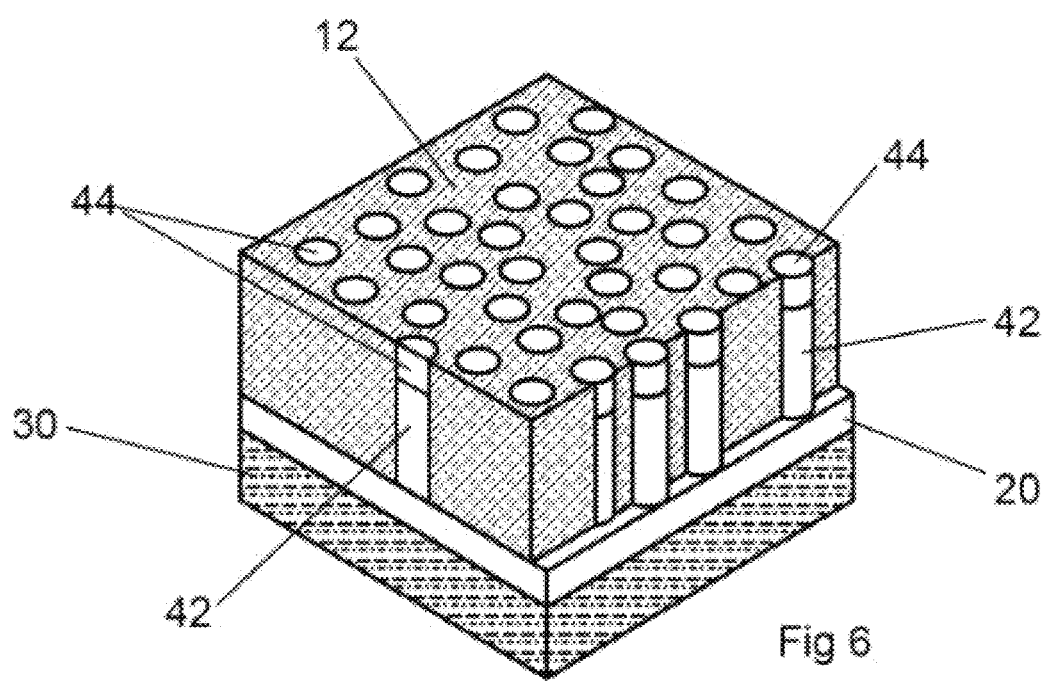
FIG. 6 shows a cross-sectional 3D representation of the present plasmonic energy conversion invention in a planar configuration.

Referring now to FIGS. 4, 5, and 6, which show the plasmonic energy conversion device from three different perspectives in an embodiment in which the plasmonic rod arrays remain encased in the nanoporous AAO layer. FIG. 4 shows a side view schematic including the planar base substrate material 30, the conductive layer 20, the nanoporous AAO or other nanoporous oxide, sulfide, or carbide layer 12, and a sectioned plasmonic rod 42 and 44 contained within the nanoporous matrix. In the FIG. 4, the exposed rod is comprised of two distinct material sections 42 (base) and 44 (cap) as shown in the schematic. FIG. 5 shows a top down view of the plasmonic energy conversion device with the surface of the nanoporous AAO layer 12 and the cap ends of the plasmonic rods 44 exposed in this view. The FIG. 6 diagram presents a 3D cross-sectional schematic of the invention illustrating the planar substrate 30, conductive layer 20, nanoporous AAO layer 12, and plasmonic rods of base section material 42 and cap section material 44. The AAO layer is largely transparent, allowing light to interact freely with the rods. It should be noted that drawings are not to scale. The plasmonic rods can be fabricated from one, two, or more materials on one or both sides of the planar substrate material. The plurality of pores in the nanoporous AAO template may be fully or partially filled with material to form rods.

Figure 7:
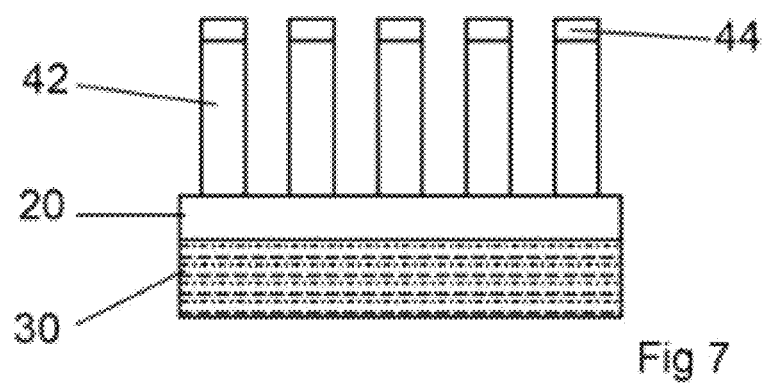
FIG. 7 shows a side view of the present plasmonic energy conversion invention in a planar configuration.
Figure 8:
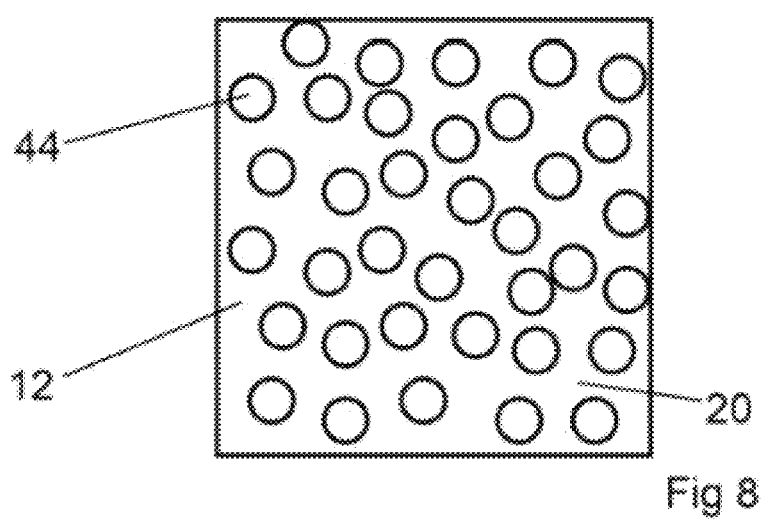
FIG. 8 shows a top down view of the present plasmonic energy conversion invention in a planar configuration.
Figure 9:
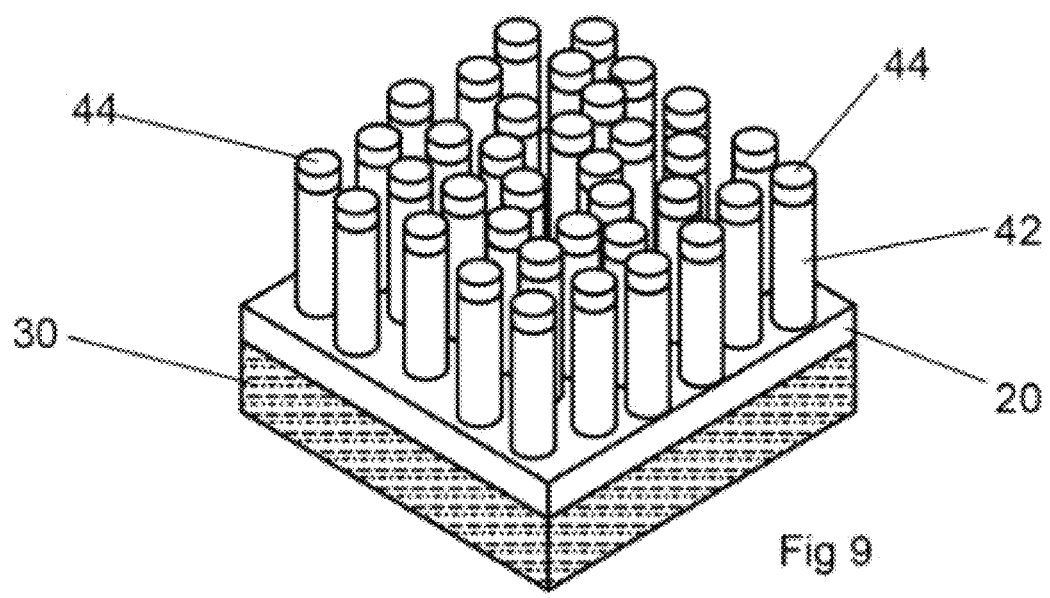
FIG. 9 shows a cross-sectional 3D representation of the present plasmonic energy conversion invention in a planar configuration.

Referring now to FIGS. 7, 8, and 9, which show the plasmonic energy conversion device from three different perspectives in an embodiment in which the nanoporous AAO or other template layer has been completely removed to fully expose the free-standing, vertically aligned plasmonic rod arrays for direct interaction with their local environment. Now, FIG. 7 shows a side view schematic representation of the plasmonic energy conversion device including the planar carrier (substrate) 30, the conductive layer 20, and a plurality of multi-sectioned rods having 42 (base) and 44 (cap). In FIG. 7 the rods have two sections being a lower (base) and an upper (cap) layer, with the base 42 being attached to the conductive layer 20 and the cap 44 being attached to the base 42. FIG. 8 shows a top-down view of the plasmonic energy conversion device showing only the top ends of the plasmonic rods 44 that are attached electrically and mechanically to the base layer 42 (not visible in this perspective) and through this to the conductive layer 20, which is itself attached to the substrate 30. FIG. 9 presents a 3D cross-sectional representation of the plasmonic energy conversion device form showing the planar substrate 30, conductive layer 20 and the plasmonic rods of base section material 42 and upper section material 44. In FIG. 9, the plasmonic energy conversion device consists of vertically-aligned, free-standing rods that appear as bristle like cylindrical structures which are exposed around their periphery and at the upper radial end to freely interact with their local environments and absorb optical energy. It should be noted that the drawings in FIGS. 7, 8, and 9 are not to scale and the rods can be made from one, two, or more material species and sections; and that nanorods can be fabricated on one or both sides of the planar substrate material presented in these FIGS. herein.

Figure 10:
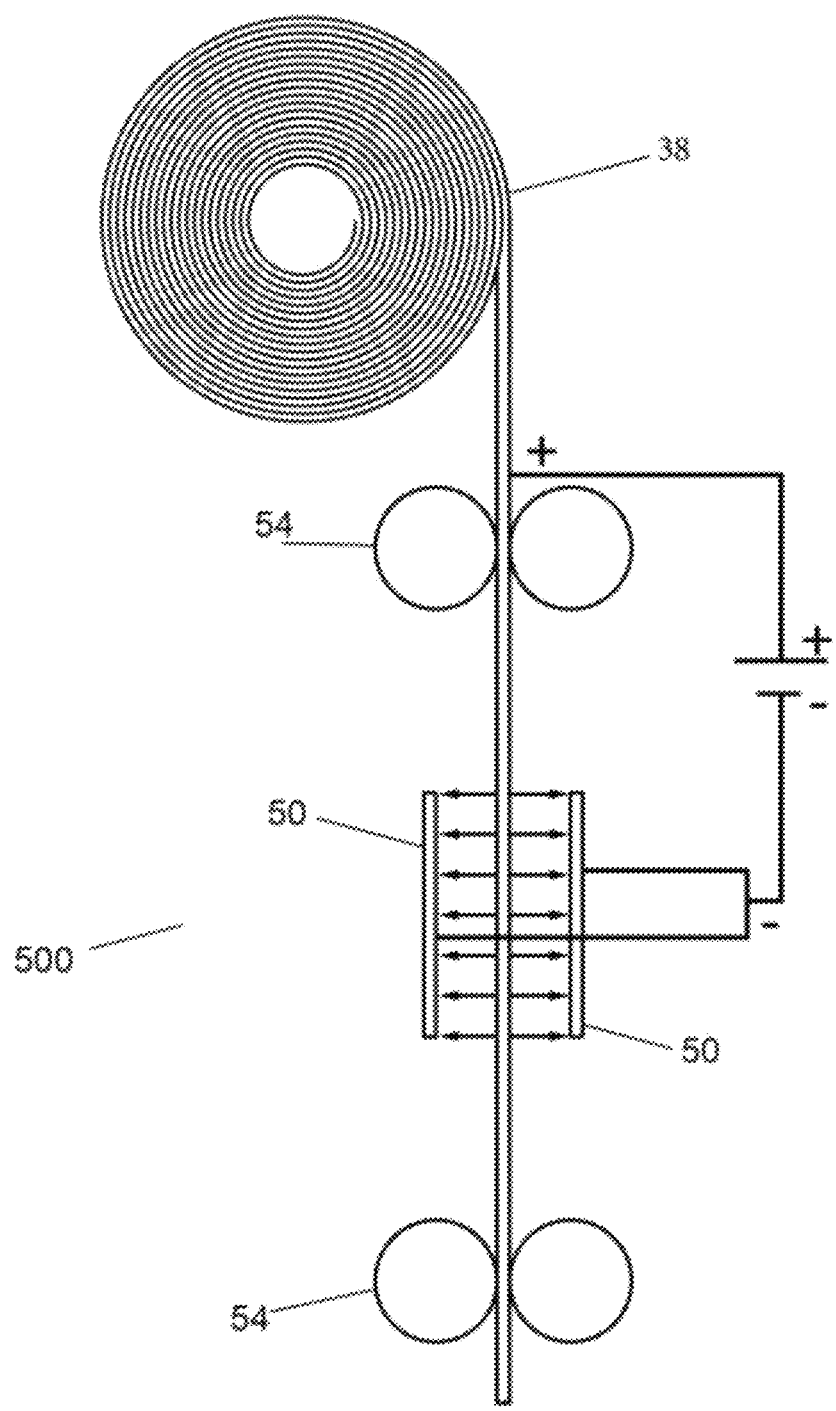
FIG. 10 shows the electrode configuration for the continuous electrochemical fabrication of the plasmonic energy conversion invention on a planar carrier and a reel-to-reel configuration.

Regarding FIG. 10 (500), which shows a schematic representation of the plasmonic energy conversion device as produced using a continuous electrochemical fabrication process in which the plasmonic energy conversion device is manufactured on a flexible, planar substrate material having a continuous reel-to-reel format, which facilitates large-scale, high-volume manufacturing. Continuing with FIG. 10 an electrode configuration 50 is presented that enables a voltage bias to be applied through a media to the material surface to perform the basic electrochemical processing required for continuous fabrication of the plasmonic energy conversion device. The continuous process begins with the spooled precursor material 38 that consists of a flexible substrate that is coated with a conductive and Al or other process layer on one or both sides. This precursor material 38 is used to electrochemically fabricate the plasmonic energy conversion device consisting of plasmonic rod arrays attached to the substrate, with the surface of 38 having a starting structural detail similar to that shown in FIG. 1 (100). In FIG. 10, the conductive layer and Al precursor coatings have been applied to both sides of the substrate, which is biased at a positive voltage relative to the parallel plate type electrodes 50 held at a negative bias creating an electric field through which the ribbon passes continuously during the nanorod fabrication process. While one electrode pair 50 being held at a particular voltage is shown to enable this schematic representation, in practice, multiple electrodes contained within multiple electrochemical baths are required to fully manufacture the plasmonic energy conversion device. The precursor ribbon 38 first undergoes anodization using an electrolytic bath that carries the process current (not shown) to create a nanoporous template layer through anodization, followed by the electro-deposition of a conductor to form plasmonic rods, as shown in FIG. 1 (300). Electric field lines are shown as arrows going from the anode (+ electrode) which is the precursor 38, to the cathodes (− electrode) 50 in a Direct Current (DC) process scenario. In FIG. 10, rollers 54 are shown schematically to indicate the isolation of the section of the ribbon being processed, both electrically and chemically, from the bulk material in the spool before or after the fabrication steps. The electrodeposition of plasmonic rods into a nanoporous AAO matrix layer formed during the anodization process is achieved using the same configuration shown in FIG. 10, while reversing the electrode polarity and replacing the electrolyte with a plating bath. While a DC voltage and single counter electrode pair is presented in the FIG. 10 representation, either Alternating Current (AC) or DC processing signals can be utilized, as well as multiple electrodes existing in different electrochemical baths that can be held at a range of potentials or supplied with a variety of processing signals (waveforms).

Figure 11:
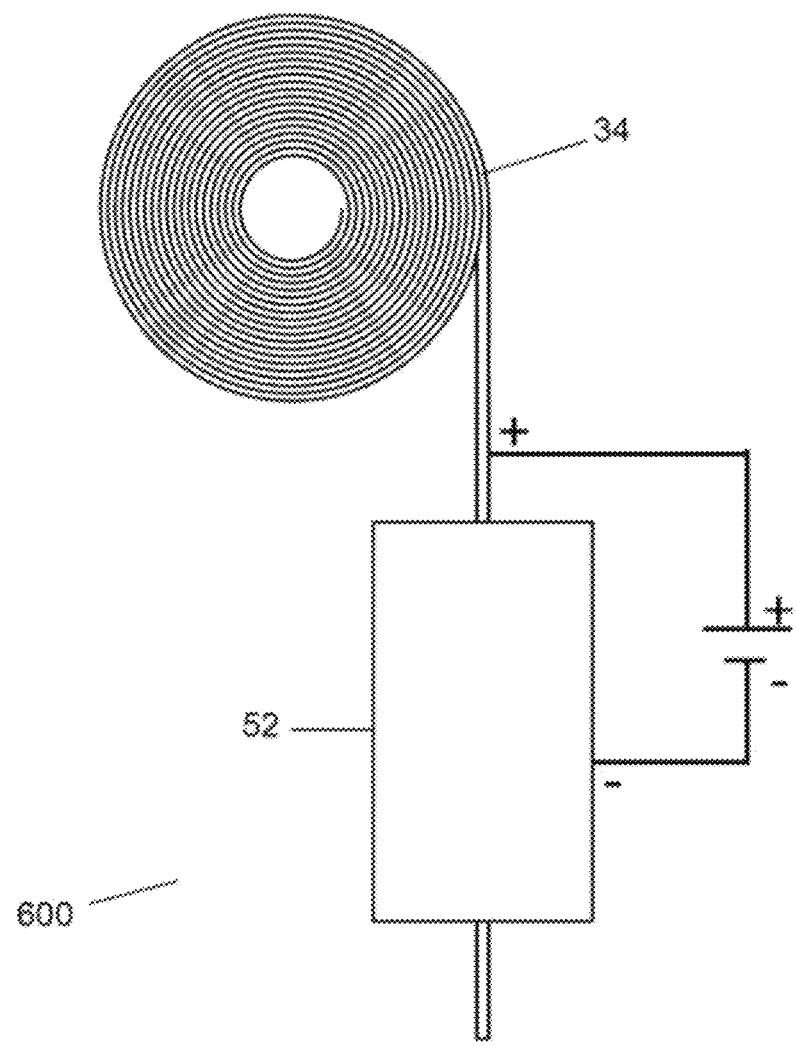
FIG. 11A shows the electrode configuration during continuous fabrication for the continuous fabrication of the present plasmonic energy conversion invention on a cylindrical thread carrier using a spooled process.
FIG. 11B shows a top view of the electrode with the flexible thread or fiber substrate passing through it.
Figure 11B:
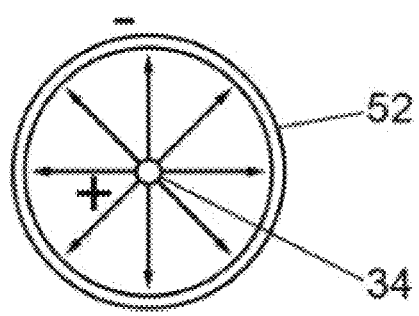

Referring now to the invention schematic shown in FIG. 11, which presents an upper schematic 600 that shows a process configuration for the continuous fabrication of the plasmonic energy conversion device using a flexible thread or fiber type substrate geometry in a reel-to-reel continuous fabrication process configuration. The spooled starting material 34 consists of a cylindrical (thread or fiber) core substrate that has been coated with a concentric conductive layer and a concentric Al or other process layer. The core may be made of an insulating or conducting material. The coated fiber 34 is shown biased at a positive voltage relative to a concentric open cylinder processing counter electrode 52 through which the fiber 34 passes continuously during plasmonic material fabrication. While one electrode is shown is this simplified representation, in practice, multiple electrodes and electrochemical baths are required to fully manufacture the plasmonic energy conversion device. The fiber precursor 34 first undergoes anodization using an electrolytic bath (not shown) co convert the Al layer to nanoporous AAO, followed by the electro-deposition of conducting material to form rods in a similar and subsequent electrochemical scenario. The lower diagram in FIG. 11 shows a cross-sectional view of the precursor fiber (anode) 34 and concentric cylindrical counter electrode (cathode) 52 under DC bias showing the symmetry of the electric field lines (arrows) going from the anode (+) to the cathode (−) required to produce a uniformly nanostructured surface on the thread. FIG. 11 shows the configuration for basic anodization of the Al or other process layer to from a nanoporous AAO, or other oxide, sulfide, or carbide template layer. The electroplating of a conductor into the nanoporous AAO matrix formed during the anodization process to form plasmonic rods is achieved using a similar configuration 600 while reversing the polarity of the voltage. While a DC voltage and single counter electrode pair is presented in the FIG. 11 representation, either Alternating Current (AC) or DC processing signals can be utilized, as well as multiple electrodes existing in different electrochemical baths that can be held at a range of potentials or supplied with a variety of processing signals (waveforms).

Figure 12:
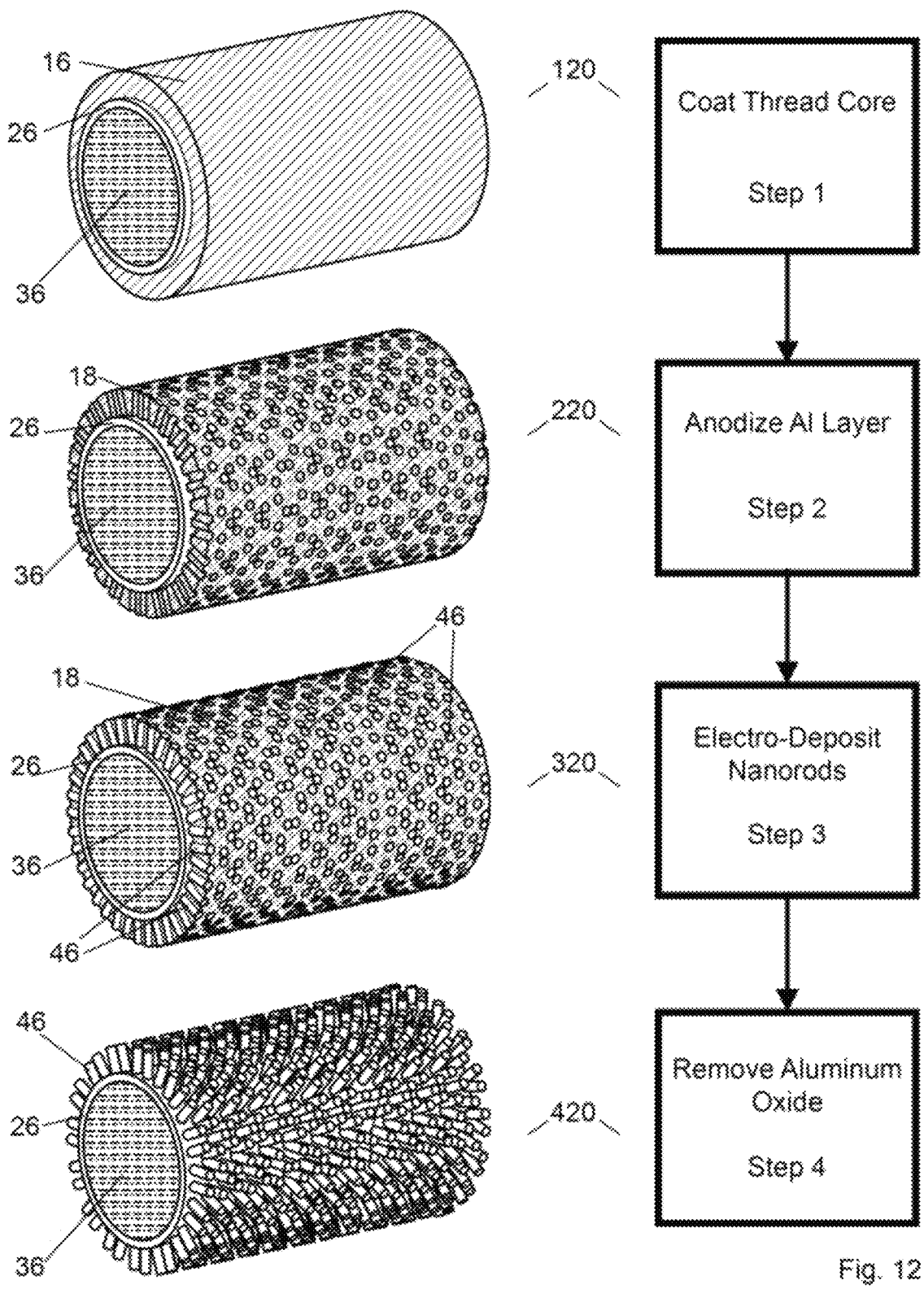
FIG. 12 is a four step process schematic showing how plasmonic rod arrays are fabricated on a cylindrical coated thread or fiber substrates.

Referring now to FIG. 12, which shows a detailed four step diagrammatical representation of the process used to fabricate the plasmonic energy conversion device on a thread, or fiber, type substrate geometry in a fashion analogous to that used for a planar substrate in FIG. 1 and also presenting two possible embodiments of the present invention. FIG. 12, Step 1 shows how the fabrication of plasmonically active rods on the thread substrate is performed starting with a precursor material 120 consisting of a cylindrical thread or fiber 36 composed of a flexible material that can be spooled for reel-to-reel processing and has been coated with a thin conformal and concentric conducting layer 26 followed by a conformal process layer of aluminum (Al) 16, or other process material, as shown. The precursor 120 in FIG. 12 is subsequently processed electrochemically. The conducting layer 26 is used as an electrode in the next two steps of the process. In Step 2 (220), the Al process layer 16 from Step 1 (120) is anodized in an electrolytic bath and completely converted into a nanoporous AAO layer 18 as shown 220. The pores in the AAO 18 penetrate fully through from the outer surface to the underlying conducting layer 26 that is attached to the fiber core 36. The nanoporous AAO layer 18 forms a template for the formation of plasmonic rods. In Step 3 (320) a plasmonic material has been deposited into the nanoporous AAO template 12 to form rods 46. The rods 46 are in robust electrical and physical contact (attached) with the underlying conductive layer 26, which in turn is attached to the substrate core 36. The Step 3 version of the present invention 320 can be utilized in this form with the rods 46 remaining encased in the nanoporous AAO 18, as the AAO is largely transparent allowing light to interact with the nanorods. Alternatively, in another embodiment, the nanoporous AAO layer 18 can be removed as shown in Step 4 (420) that reveals an array of free-standing, vertically-aligned plasmonic rods emanating radially from and attached to the underlying conductive layer 26, which itself is attached to the core substrate material 36. The rods have a bristle like appearance under ample magnification. It should be noted that the drawings are not to scale.

Figure 13A:
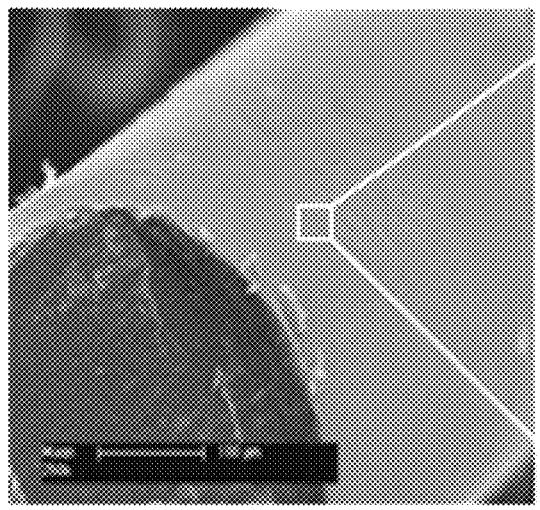
FIG. 13A shows SEM images of nanoporous AAO coatings on a thread.
Figure 13B:
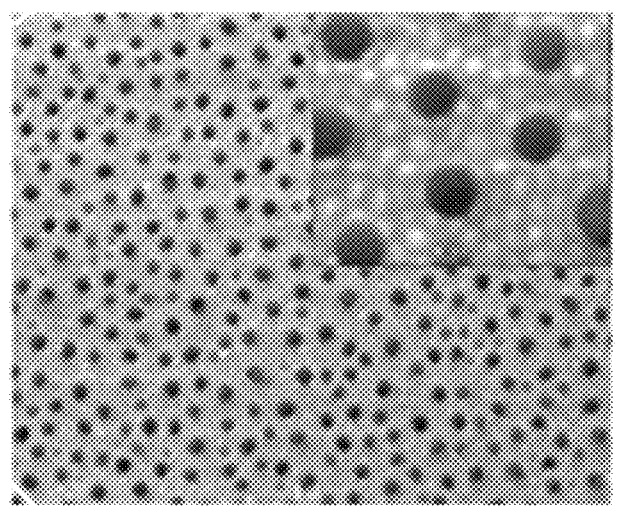
FIG. 13B shows a zoomed-in view of the SEM image of the AAO coatings on the thread.

Referring now to FIG. 13, which presents a series of SEM images showing a nanoporous AAO layer produced on the surface of a fiber or thread material at increasing magnification in a form analogous to FIG. 12, Step 2 (220). The image on the left of FIG. 13 shows a full diameter (200 micron) cross section of the cylindrical thread carrier with the nanoporous AAO layer on the surface. The right side of FIG. 13 shows two higher magnification SEM images that reveal the details of the nanoporous AAO structured surface are presented. The density of the pores is $2.4 \times 10^8/cm^2$ with an average pore diameter of 305 nm and a center-to-center spacing of 740 nm. The images in FIG. 13 show by example the engineering of the present invention on a fiber or thread type material format.

In furtherance of detailing the description of the plasmonic energy conversion device, attention is once again garnered to FIG. 1 and details of the constituent materials that comprise the various structures and components presented in the four step schematic representation. The precursor material used to produce the invention is shown in a single-sided planar representation in FIG. 1 (100), in which the substrate 30 has a conductive layer 20 and an Al or other process layer 10 attached to the surface. In the simplest scenario, all three layers in 100 can be the same material as in the case of an Al foil precursor. A large range of materials can be used for the substrate 30, including insulating, conducting, and semiconducting materials that are transparent or opaque. Still referring to FIG. 1 (100) Step 1, the thin-film conducting layer 20 must function as an electrode in the subsequent fabrication of the invention as represented in Step 2 (200) and Step 3 (300) of FIG. 1, and hence be conductive and thus having a sheet resistance below 100 ohms per square. The conducting layer 20 can be transparent or opaque and is typically thin compared to the substrate 30 or the Al process layer 10. In many embodiments of the invention, the conducting layer 20 and Al layer 30 must be applied to the substrate as thin-film coatings on one or both sides of the substrate 30. For the invention to be robust and durable there must be strong adhesion of the conductive layer 20 to the substrate 30, and thus, depending on the materials being used, a very thin adhesion layer between the conductive layer 20 and the substrate 30, and likewise, between the conductive layer 20 and the Al layer 10 may additionally or otherwise be utilized. By example, a 1 mm thick glass substrate could have a 25 nm thick silver conducting layer with a 1-5 nm thick titanium adhesion layer deposited between the silver and the glass, or similarly, to aid in the adhesion of the Al layer on ITO coated glass, a 2-3 nm thick adhesion layer of aluminum oxide ($Al_2O_3$) can be deposited between the ITO and the Al.

Still referring to FIG. 1, Step 2 (200) in fabricating the invention involves anodizing the Al layer to completely convert it to nanoporous anodic aluminum oxide (AAO) 12 that is subsequently used as a template for nanorod array fabrication. The anodization is carried out in an electrolytic bath under DC bias using a cathode with symmetry to the anode and is performed until all the Al metal is converted into $Al_2O_3$ and the pores in the layer 12 penetrate through to the underlying conductive layer 20. The anodization may be performed as a function of time for a set period or by monitoring the current to determine when the Al metal has been completely converted to AAO. The electrochemical oxidation of Al metal can result in the "self-assembled" growth of a hexagonally ordered nanoporous $Al_2O_3$ matrix, in which the diameter and spacing of the nanopores can be controlled by varying the anodization voltage, the electrolytic chemical types, and the concentrations used. A uniform nanoporous AAO layer is formed by fully anodizing the Al in a variety of acidic electrolytes (e.g. sulfuric, oxalic, glycolic, phosphoric, malonic, tartaric, malic, citric or other acids) under DC voltage. A stainless steel mesh cathode with symmetry to the anode (sample) is utilized. Nanoporous AAO can be formed with pore diameters ranging from 2-900 nm on a 35-980 nm pitch thus obtained by adjusting the process parameters of voltage, electrolyte type, electrolyte concentration, temperature, and surface pretreatments. Anodization is performed in the 20-200 V DC range depending on the desired AAO metrics. The pores can be widened and any remnant $Al_2O_3$ is cleared from the interface of the nanoporous AAO 12 and the conductive layer 20 using a post-anodization chemical etch.

Still referring to FIG. 1, Step 3 (300) in fabricating the present invention involves the template formation of metallic rod arrays 40 in the nanoporous AAO layer 12 by the deposition of plasmonic material into the AAO. The preferred method to form plasmonically active rods by template synthesis using a porous matrix template structure is via electrochemical deposition of the plasmonic material species into the openings of the porous matrix; although other methods such as chemical vapor deposition (CVD), pulsed vapor deposition (PVD), Atomic Layer Deposition (ALD) and electroless chemical deposition can also be utilized as alternate approaches to rod formation. Plasmonic materials that can be used to form the nanorods 40 include silver, gold, aluminum, copper, cobalt, chromium, iron, molybdenum, manganese, indium, nickel, palladium, platinum, rhodium, tantalum, titanium, titanium nitride, tungsten, silicon, tin, zirconium nitride, zinc, iridium, and others including various alloys, nitrides, and oxides of the aforementioned materials. Other plasmonic materials consist of highly doped semiconductors (Si, Ge, and III-V materials) and transparent conducting oxides. When formed by electro-deposition, the plasmonic rods 40 are formed upwards from the conductive layer and can be made to completely or partially fill the AAO nanopores 12 as desired by controlling the deposition rate and time. The present plasmonically active rods can be used with the AAO layer retained 300 or removed 400 to expose the plasmonic rods to the local environment. The aluminum oxide can be removed by a chemical etch to expose the free-standing, vertically aligned plasmonically active rods 40. Alternatively, the porous matrix can be removed by plasma or vapor etching techniques. The material embodiment with the AAO retained 300 has the qualities of being mechanically robust, chemically resilient, and radiation tolerant, with a large amount of the rod material protected by encasement in the AAO matrix. On the other hand, the exposed rod format of the invention 400 has a highly enhanced surface area available for direct interaction with a variety of local environments. For example, a 1 $cm^2$ surface with plasmonic rods of 50 nm diameter, 500 nm length, and a density of $10^{10}/cm^2$ has 17 times the surface area compared to a planar material, and thus, 17 times the area for vapor generation. In either form 300 or 400, the present invention can be used to transduce optical energy into thermal energy and further transfer the thermal energy (heat) to a gaseous or liquid material in contact or close proximity to the plasmonically active rods. By example, the photothermal effect can be used to convert optical energy into steam if the material is immersed in water, to separate mixed liquids via distillation, or to alter the chemical configuration and bonding of molecules in a gas or liquid through catalytic processes. The exposed rod configuration 400 can further offer applications for optical sensors to analyze gases and liquids, or for use as enhanced surface area electrodes.

In an embodiment of the four step process for fabricating the plasmonic energy conversion device as presented in FIG. 1, the starting substrate 30 is a 25 mm×75 mm×1 mm borosilicate glass slide that is coated with an indium tin oxide conductive layer 20 that is ~80 nm thick with a sheet resistance of 14 ohms/sq in a vacuum evaporator system using standard rf magnetron sputter coating or electron beam evaporation based coating techniques. Without breaking vacuum, an Al layer 10 that is 800 nm thick is then deposited on top of the ITO layer by electron beam evaporation such that the two layers are adhered to each other and hence, the underlying substrate. Deposition techniques such as ion beam assisted electron beam evaporation are employed to minimize the formation of grains and grain boundaries and maximize the density of the materials as the thin films are being prepared.

Continuing with Step 2 (200) in FIG. 1, in a representative process, the Al layer is anodized in a solution of 3 wt % oxalic acid at 5° C. and 80 volts until all the Al metal is consumed and the pores in the AAO penetrate through to the ITO layer. Electrical contact is achieved either by masking a portion of the sample such that an electrical contact external to the electrolyte can be achieved, or by utilizing a submersible electrode geometry via an o-ring mediated dry contact. The process time depends on the Al layer thickness, and for the 800 nm thick Al layer in this example, it is 15-18 minutes and is best performed by monitoring the current and optical properties of the sample under anodization and halting the process when all the metal has been converted into oxide. As the pores form and grow in the AAO and they begin to penetrate the Al/ITO interface, the anodization current increases, and when the current reaches 2-3 times its steady state value, this indicates that the Al metal has been completely oxidized (consumed) and the process is stopped. The point of complete Al anodization is also marked by this sample becoming optically transparent. The AAO pores are subsequently widened and remnant Al2O3 cleared from the bases at the AAO/ITO interface by etching in a 5 wt % solution of phosphoric acid at 38° C. for ~15 minutes.

Figure 14A:
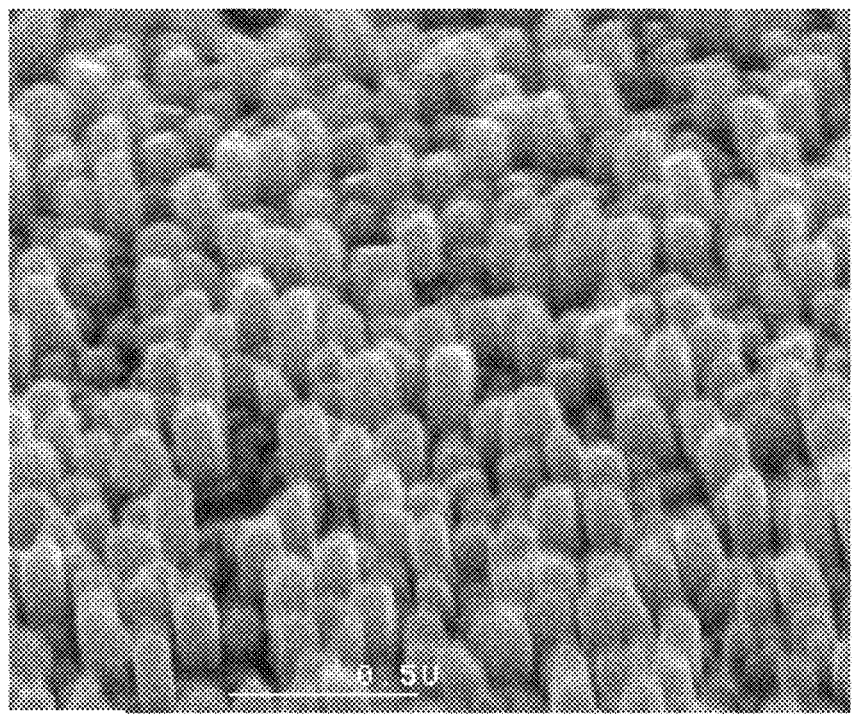
FIG. 14A shows SEM images of low aspect silver plasmonic rod arrays.
Figure 14B:
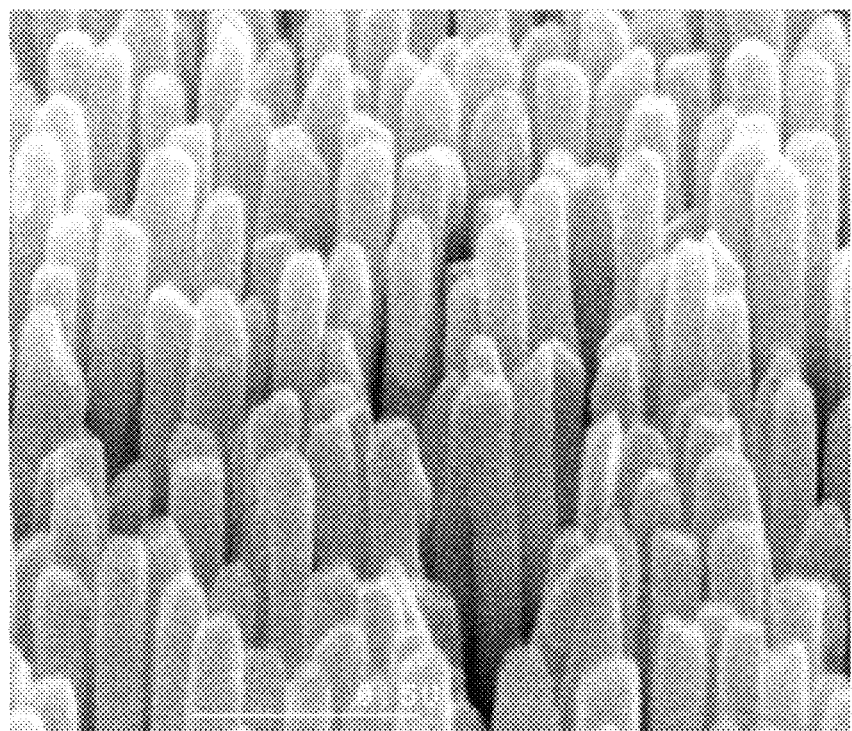
FIG. 14B shows SEM images of high aspect silver plasmonic rod arrays.

Continuing the process by example in FIG. 1, Step 3 (300), plasmonic rod arrays 40 are then formed by electro-deposition of Au (gold) or Ag (silver) from aqueous solution into the AAO template, and are produced by ac electrolysis. This is typically conducted at 10-25 kHz and a level of 1.0-5.0 $V_{AC}$ using an arbitrary waveform generator with a sine wave and with a 50-100% voltage offset applied. Various pulsed signals and other waveforms can be used to fine tune the deposition. A typical gold electro-deposition bath is a pH of 6.5 solution of gold sulfite and the deposition is performed with the bath at 58° C. Silver can be electrode-posited from a pH of 8.0 solution of silver succinimide used at 60° C. After forming the plasmonic rods from electro-deposition solutions of either gold, silver, or the two sequentially, the AAO matrix can be fully removed as in Step 4 (400) by etching in a 5 wt % solution of phosphoric acid at 38° C. or sodium hydroxide at 30° C., depending on the materials being used and the amount of etch time required to expose the fully formed, free-standing vertically aligned plasmonic rod arrays will vary. FIG. 14 shows SEM micrographs of two silver rod arrays having short (low-aspect) and long (high-aspect) rods that were fabricated on ITO coated glass substrates using the above outlined technique as described and presented schematically in FIG. 1. The plasmonic rods in the present invention can have a diameter of 10-100 nm or 50-200 nm or 100-1000 nm. The height (length) of the rods can be from 10 nm to 100 microns and is typically in the range of 100 nm to 10 microns.

Now, regarding FIG. 3 as it relates to the 4-step process elucidated in FIG. 1 and described conceptually and by example in the above text, FIG. 3 represents a desirable extension for fabrication of the present plasmonic invention using a continuous process and a reel-to-reel format suitable for large-scale industrial manufacture. As an example of a commercially available substrate materials that could be used to manufacture the invention as presented in FIG. 3 in a reel-to-reel format 32 that are presently available include: flexible glass available from Corning® as Willow® glass product that is a 100 microns thick glass; a variety of polymers such as polyimide available from Dupont® as Kapton® or polyvinyl fluoride (PVF) available from Dupont® as Tedlar®; a variety of metal foils or metallic coated polymers; or advanced ultra-thin carriers such as produced using graphene. Still referring to FIG. 3, the production of plasmonic rod arrays 40 on a spooled substrate 32 requires a conductive layer 20 and an Al or other process layer as outlined above. The versatility provided by flexible glass allows the final device to have optimized solar energy harvesting forms and designs other than planar to be utilized. For example, the plasmonic energy conversion material or vapor generation device can be rolled and inserted in an evacuated tube type solar collector as commonly used in concentrated solar power system designs. Similarly, for high optical intensities multiple layered or stacked, or louvered, "venetian blind" type geometries may be used to design optical collectors for maximum light absorption and subsequent vapor generation. Continuous reel-to-reel physical vapor deposition vacuum coating systems that offer magnetron sputter coating and e-beam evaporation in one unit are available and can be used to coat substrates as needed. Industrial materials manufacturers such as Dupont® and Corning®, for example, also offer metalized version of their materials. Another method to produce a reel-to-reel precursor material is to cold press an Al layer onto a second material by "cold-rolling" where an Al foil is clad onto a metal or other carrier foil under extreme pressure such that there is a 50-60% reduction in the total thickness during the process. The cold rolling work is typically followed by an annealing step to better attach the layered materials, however, this must be done without forming any undesirable alloys in the interface. Polymer backings can be applied to the metal layers after performing the cold work as desired.

Referring now in more detail to FIGS. 4, 5, and 6 that show side, top-down, and 3D cross-sectional views, respectively, of an embodiment of the plasmonic energy conversion device in which the plasmonically active rods 42 and 44 are comprised of two different material sections that primarily remain embedded in the nanoporous AAO template 12 are utilized. While two materials are shown for example, one, two, or more different material layers may be produced in practice. All aspects of this embodiment are produced when fabricating rods on one or both sides using the reel-to-reel or ribbon format 32 as shown in FIG. 3. Still referring to FIGS. 4, 5, and 6, the conductive layer used in the device can be made from a number of materials including: a metal such as silver, gold, aluminum, tungsten, nickel, palladium, cobalt, molybdenum, platinum, copper, zinc, iron iridium, or many others; transparent conductive oxides such as ITO, aluminum-doped zinc oxide (AZO) and others; conducting polymers such as PEDOT; and carbon nanotube (fullerene) or graphene based conductive layers. By example, hybrid silver capped gold plasmonic rod samples are prepared in a nanoporous AAO template first prepared on silver coated glass by first performing electro-deposition of silver from a silver succinimide bath for a set time period corresponding to a desired rod length, and then rinsing in DI water followed by electroplating gold from a gold sulfite solution for a set period of time corresponding to a desired layer thickness followed by a DI water rinse. In this embodiment, and referring to FIGS. 4, 5 and 6, the porous matrix of AAO 12 encases the rod walls and protects the rod side surfaces 42 and 44 from environmental or mechanical degradation in many applications, as only the cap ends of the rods 44 are exposed to the local environment. AAO is a robust, semi-transparent material with a melting point in excess of 2000° C., which functions well in photothermal applications of the invention, particularly in chemical environments that otherwise, may have a deleterious effect on the nanorods themselves. The cap 44 generally acts to protect the base 42 materials by utilizing appropriate materials for the targeted environment. Sections of the rods, 42 and 44, are made of plasmonic materials such as s silver, gold, aluminum, copper, cobalt, chromium, iron, molybdenum, manganese, indium, nickel, palladium, platinum, rhodium, tantalum, titanium, titanium nitride, tungsten, silicon, tin, zirconium nitride, zinc, iridium, and others including various alloys, nitrides, and oxides of the aforementioned materials; however, in multi-section rods, some sections may be composed of other, non-plasmonic materials. The use of a cap material on the rods 44, may be chosen as a non reactive substance for certain applications and environments, or, it can be made of an intermediary binding material that will attach to a target molecule for sensor or photo-catalytic applications. In one embodiment, the rod base 42 is the plasmonically active material, heats the cap 44 which then intermediates a reaction between molecules that come in contact with the exposed surface and is used as a photo-active catalytic material for applications in reactors and other synthesis apparatus.

Referring now in more detail to FIGS. 7, 8, and 9 that show side, top-down, and 3D cross-sectional views respectively of an embodiment of the plasmonic energy conversion device in which rods 42 and 44 are comprised of two different material sections and are primarily freestanding. While two materials are shown for example, one, two, or more different material layers may be produced in practice. All aspects of this embodiment are produced when fabricating plasmonic rods on one or both sides using the reel-to-reel or ribbon format 32 as shown in FIG. 3. Still referring to FIGS. 7, 8, and 9, the conductive layer used in the device can be a metal such as silver, gold, aluminum, tungsten, nickel, palladium, cobalt, copper, chromium, titanium, molybdenum, platinum, zinc, iridium, iron, or many others; transparent conductive oxides such as ITO, aluminum-doped zinc oxide (AZO) and others; conducting polymers such as PEDOT; and carbon nanotube (fullerene) or graphene based conductive layers. In the present invention, the rods provide an enhanced surface area that is increased by up to a factor of 1000× over a planar surface depending on the diameter, length, and center to center spacing, while in practice the surface area enhancement factor is typically from 2-100×. The enhanced surface area in the invention is of great benefit for vapor generation applications such as photothermal steam generation or distillation. Further applications that utilize the enhanced plasmonic rod surface exist are in catalysis and electrolysis. Still referring to FIGS. 7, 8, and 9, the sections of the rods, 42 and 44, are made of plasmonic materials such as silver, gold, aluminum, copper, cobalt, chromium, iron, molybdenum, manganese, indium, nickel, palladium, platinum, rhodium, tantalum, titanium, titanium nitride, tungsten, silicon, tin, zirconium nitride, zinc, iridium, and others including various alloys, nitrides, and oxides of the aforementioned materials, however, in multi-section nanorods some sections may be composed of other, non-plasmonic materials. The use of a cap material on the nanorods 44, may be chosen as a non reactive substance for certain applications and environments, or, it can be made of an intermediary binding material that will attach to a target molecule for sensor or photo-catalytic applications.

Turning now to applications of the plasmonic energy conversion device that consists of an array of plasmonically active rods on the surface or surfaces of planar, fiber or other substrates suitable for conformal coating and electrochemical processing. The metallic/conducting rods exhibit plasmon resonance and are fabricated such as to maximize the absorption of incident light and hence, maximize the conversion of this incident radiation into heat, which takes place through the generation of plasmons. The energy exchange takes place when radiation incident on the device induces plasmons, which then manifests physical phenomena such as intense electric fields in the vicinity of the rods, and, as heat generated within the rods. A maximum in the amount of light absorbed within an array of plasmonically active rods occurs at a material and geometry dependent optical wavelength (frequency) known as the plasmon resonance wavelength, $\lambda_R$. Optical absorption and the excitation of plasmons occurs on and off resonance, but is a maximum at $\lambda_R$. The intense electric fields associated with plasmons leads to interactions with electric dipoles in the vicinity of the plasmonic structures, while the heat subsequently generated in the very small rod volumes results in elevated temperatures of 100's of degrees centigrade producing unique localized photothermal phenomena: such as the direct generation of steam from ambient temperature water with high efficiency.

Figure 15A:
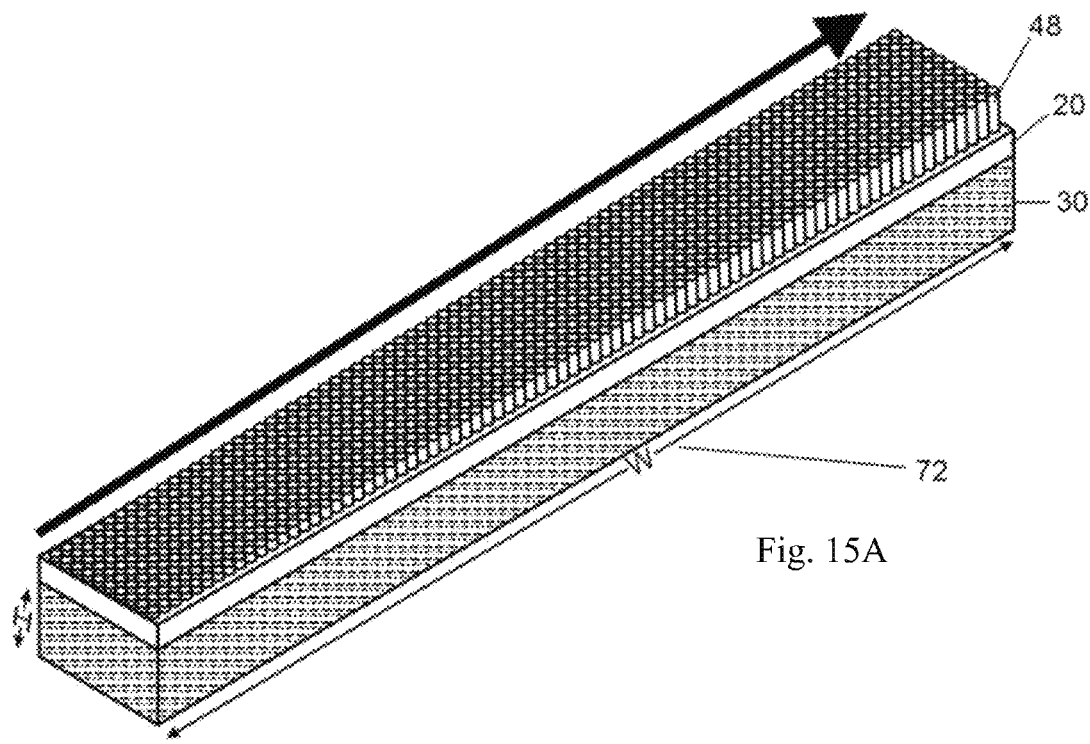
FIG. 15A shows the present invention with a plasmonic rod length gradient.
Figure 15B:
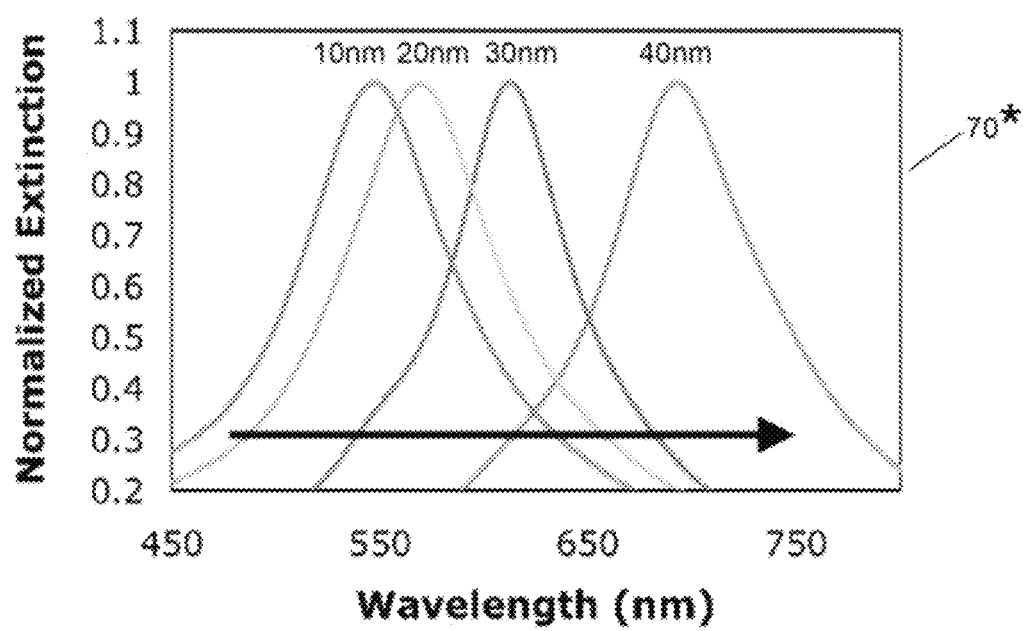
FIG. 15B is a summary graph showing an example broadband optical absorption properties of that type of embodiment.

The plasmonic energy conversion device matches the optical response of the plurality of plasmonic rods to the spectrum of the optical source interacting with it in order to maximize the efficiency of the energy conversion process. When using a monochromatic light source such as a laser, it is desirable to have the maximum optical response of the device ($\lambda_R$) to be peaked at the wavelength of the laser, i.e., the rods are as close to identical in size and shape as possible resulting in a sharp collective resonance at $\lambda_R$, being the wavelength where the laser also operates. On the other hand, for a broadband source of radiation like the sun, it is necessary to broaden the optical response of the material to match the absorption to the incident spectrum and capture significant amounts of power. A requirement for an effective photothermal solar cell is that the material has high absorption and low emission across the effective spectral width of the solar band, that is, wavelengths of approximately 250-2500 nm. The plasmonic energy conversion device can be optimized for either broad or narrow band optical response. Optical tuning is achieved by controlled manipulation of the volume, shape, size, and composition of the plasmonically active rods to tune their optical response, and subsequently achieve the desired absorption of radiant energy by the device. By example, the concept of plasmonic resonance tuning is demonstrated in FIG. 15, which shows an example of how optical extinction (absorption) can be systematically tuned to a particular wavelength 70 as demonstrated here for lithographically-produced silver nanorod arrays on optical substrates. These spectral data in FIG. 15 show a plasmon resonance peak $\lambda_R$ occurring at ever longer wavelengths as the width of the nanorods is systematically increased from 10 nm to 20 nm to 30 nm to 40 nm, and $\lambda_R$ is "tuned" from 535 to 740 nm, simply by increasing the one nanorod dimension. Along these lines, a particular geometry can be used to match a laser line in one embodiment, while, a plurality of different geometries (lengths, diameters, shapes) can be combined to achieve broadband absorption in another embodiment. By example for the plasmonic energy conversion device, FIG. 14 shows SEM images of two different geometries of plasmonically active silver rod arrays in the exposed rod embodiments of the plasmonic energy conversion device, and these two arrays have different $\lambda_R$ values by virtue of the different size and material volumes of the rods Similarly and also by example, FIG. 209 also shows high and low aspect plasmonically active gold rod arrays.

Broadband absorption in the device can be achieved by creating a range of plasmonically active rod sizes that are intentionally engineered for broadband absorption by selecting a range of rod dimensions that correspond to the range of wavelengths in the broadband spectra. In one embodiment, a gradient in rod lengths across a section or region of substrate material width can be engineered, as shown schematically in FIG. 15 presenting a section of the device 72 in a broadband embodiment consisting of a planar substrate 30 with the conductive layer 20 and an array of freestanding vertical plasmonic rods 48 having a length gradient produced across the width (W) of the continuous planar material, which is an extension of the previous designs presented herein. In this broadband absorbing embodiment of the plasmonic energy conversion device, the absorption of light across the width W in FIG. 15 is a maximum (at resonance), going from shorter to longer wavelengths as the nanorod length increases. While a single gradient in length is shown across the width of the ribbon in FIG. 15 (70) for example, other gradients (diameter, spacing, and material composition) in the nanorods, conductive layer, or substrate can be used singularly or in combination to manipulate and control the optical response of the device. Broadband absorption can be achieved by ordered means such as a gradient of lengths, or a disordered one such as a distribution of sizes randomly dispersed across the surface with varying rod lengths, diameters, or both. The gradient is produced by either: mechanical methods where the exposure to production chemicals (plating baths) is controlled or materially engineered where a gradient in the conductivity of the conducting layer is used to achieve non-uniform electroplating or other alterations of the process from one side of the substrate to the other, or in various regions of the material. A conductive layer with varied resistivity across the surface can be achieved using a deposition mask to partially shadow the substrate and thus have the amount (thickness of the conductive layer increase (or decrease) going from one side (section, region) to the next. This occurs because the gradient of conductivity introduces a gradient or dispersed variation of current and thereby a gradient in the rate of electroplating, and hence, either a gradient or dispersion of rod lengths. The gradient will initially be engineered in the rod lengths mechanically; by slowly removing the substrate from the electroplating bath during the electrode position process. This is accomplished with a custom fixture equipped with a computer controlled variable rate stepper motor that slowly extracts the sample while depositing, and thus varying the electrodeposition time (length) depending on position. The areas of the substrate with the longest time in the plating bath have the corresponding longest rods. Typical electro-deposition rates are 100-nm/minute, and thus a stepper motor can be used to slowly uplift the substrate and build the gradient. In one embodiment, a length gradient in rods ranging from about 100 nm to 500 nm is desired.

In another embodiment, the plasmonically active rod geometry is altered using a range of nanowire lengths or a range of nanorod diameters over the surface. These may be randomly distributed or dispersed in some other form than a gradient going from one side (region) of the device to another. For example, a conductive coating can be sprayed coated onto a glass substrate resulting in an island network of local areas with varying conductivity beneath the AAO or other matrix from pore to pore, and therefore, producing a material in which the length of the plasmonically active rods varies over the surface because the electro-deposition rate would correspondingly differ from pore to pore. In any case, the desired geometry of the rods is determined by the range of wavelengths of light that the device receives. Typically, the wavelength range is the spectra of sunlight received at the Earth's surface. As a result, the maximum range of lengths for the rods would be from about 20 nm to about 2 micrometers. Further, the diameters of the rods would be from 20 nm to 900 nm. In a preferred embodiment, the lengths of the rods will range between 50 and 500 nanometers and the diameters will range from 30 and 250 nanometers. In any case, the plasmonic rod geometries are selected in order that the peaks in the spectra of electromagnetic radiation that comes into the device have a corresponding set of rods that are optimized for those peaks.

The plasmonic energy conversion device can be used to generate vapor from a liquid by photothermal interaction. The efficiency of direct vapor generation by an illuminated submersed component is given by: $n = mh_{LV}/P_{in}$, where m is the mass change in the liquid volume over time, $h_{LV}$ is the enthalpy of the liquid-vapor phase change, and $P_{in}$ is the illumination intensity at the component surface. By example, the plasmonic energy conversion device can be used to create steam from water using solar energy. Steam generation lies at the heart of many industrial processes as a high-capacity thermal energy storage medium, and it is used substantially in the generation of electricity by turbine throughout the world. Steam is used for commercial and residential heating, refineries, food processing, and at chemical plants. It is used for sterilization in instruments such as autoclaves, and for cleaning, humidification and many other applications. Regardless of the source, steam is typically produced by bulk liquid heating. The direct, light-induced, generation of steam is a different approach that is being utilized in the plasmonic energy conversion device. While solar steam provides an example of an optically induced generation of vapor application of the plasmonic energy conversion device, the plasmonic energy conversion device may be used by other applications, such as in distillation, chemical refinement, and catalysis.

Figure 16:
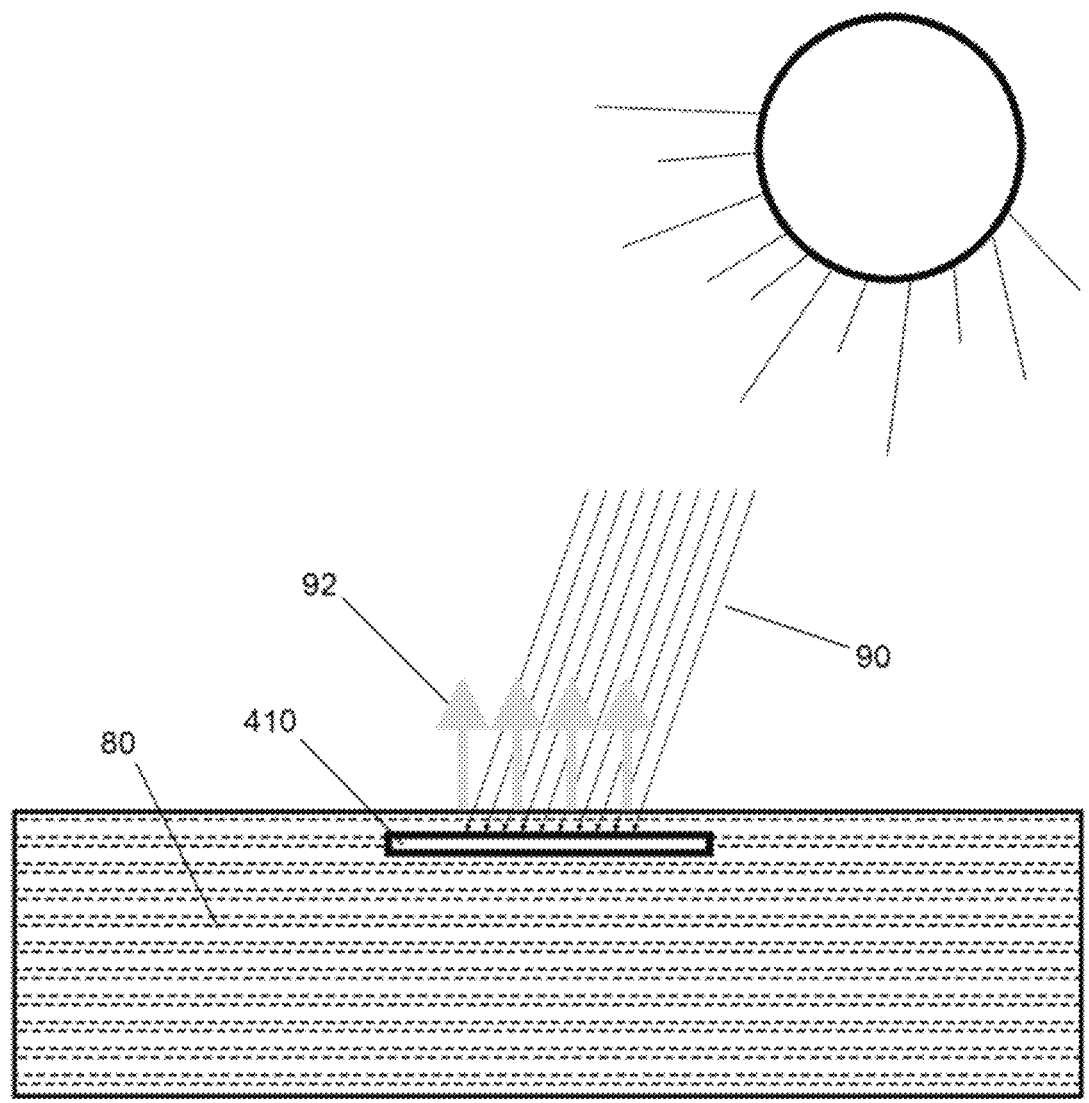
FIG. 16 shows the present invention being used in a solar steam generation application.

Referring now to FIG. 16, which shows a schematic representation of the plasmonic energy conversion device in an application for the photothermal vaporization of a liquid, particularly by example, to generate steam through the absorption of solar energy using a continuous non-permeable material with plasmonically active rods fabricated on one or or both surfaces. In FIG. 16, the plasmonic energy conversion device 410 in a planar embodiment is shown immersed in a liquid 80 and under optical illumination 90 with the light absorption occurring in the plasmonic energy conversion device that is situated just below the liquid surface. In regard to the solar steam embodiment by example, referring still to FIG. 16, solar energy radiation, (photons) 90 are shown incident upon the surface of the device 410 which is immersed in water 80. The photons 90 are absorbed, leading to the excitation of plasmons in the rods, and hence, photothermal energy conversion takes place resulting in the generation of steam 92 which rises from the surface of the device 410. It is of note that the plasmonic energy conversion device is not a thermodynamic blackbody, and hence, has smaller energy losses due to re-radiation. The device is an energy transducer.

Figure 17:
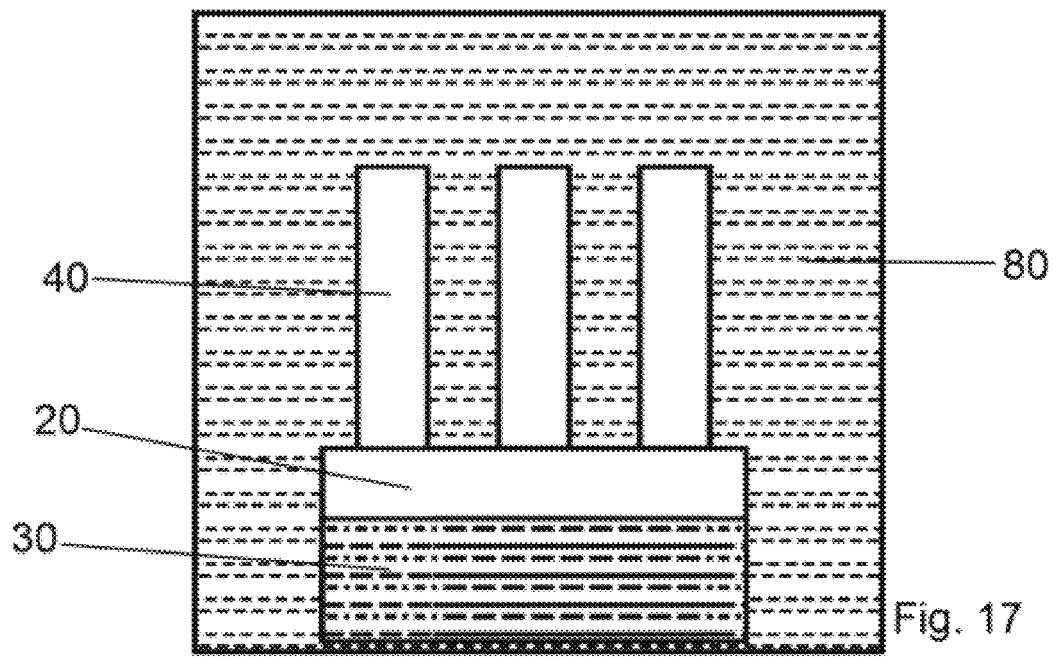
FIG. 17 shows detail of the plasmonic energy conversion invention in a liquid under optical illumination.
Figure 18:
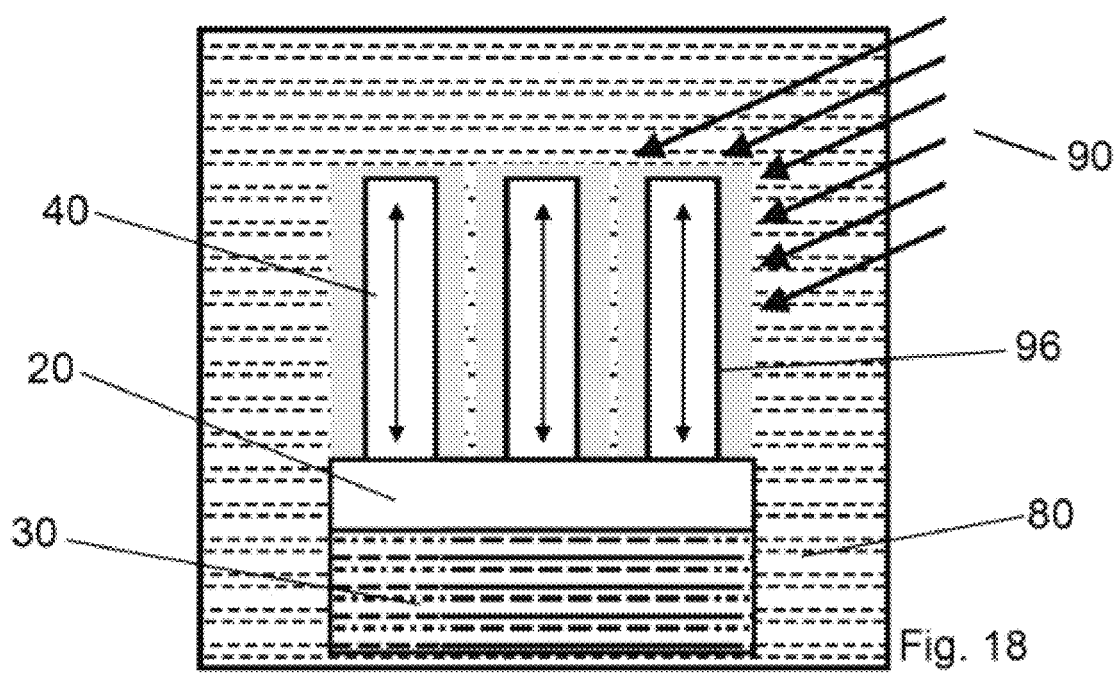
FIG. 18 shows detail of the plasmonic energy conversion invention in a liquid under optical illumination showing the plasmonic response.
Figure 19:
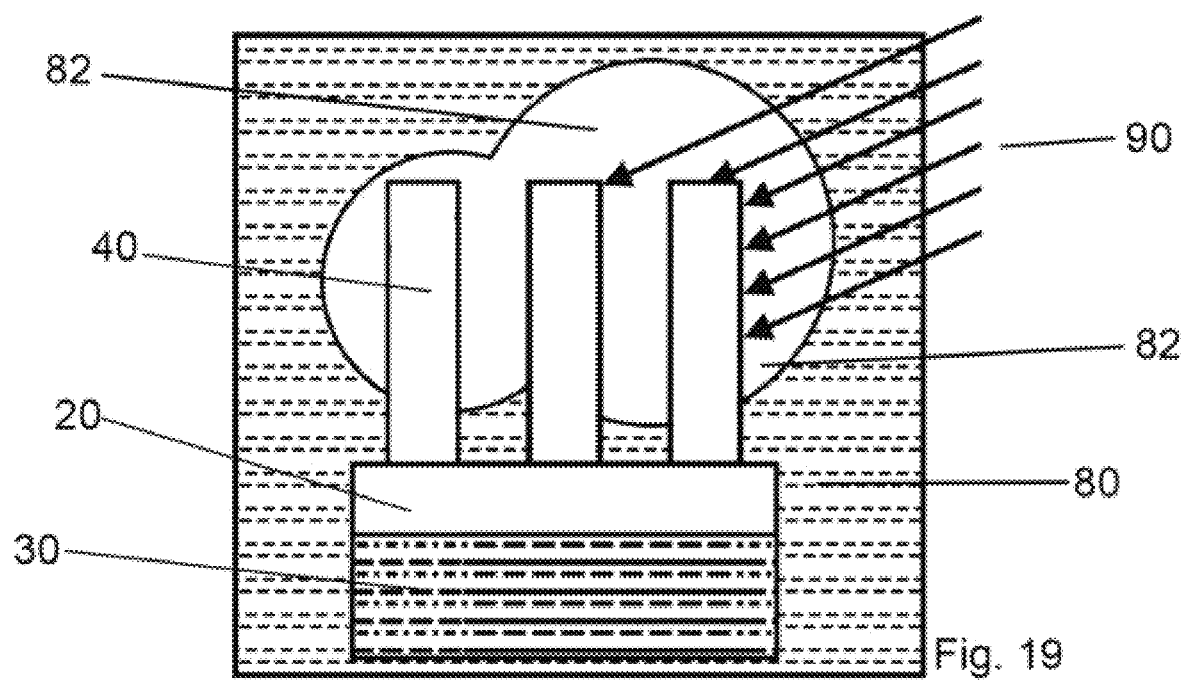
FIG. 19 shows detail of the plasmonic energy conversion invention in liquid under optical illumination showing the creation of steam bubbles.

Now, referring to the vaporization of liquids and the example of the generation of solar steam using the plasmonic energy conversion device in more detail, we refer to FIGS. 17, 18, and 19 to further elucidate the mechanism of light induced vapor production, particularly solar steam generation. In the FIG. 17 schematic, the plasmonic energy conversion device consisting of a substrate 30 with a conducting layer 20 with a plurality of free-standing, electrically conductive plasmonically active rods 40 attached, which are wetted by a fluid, shown in one embodiment as submerged in liquid (water) 80 under non-illuminated (dark) conditions. In FIG. 18, the plasmonic device consisting of a substrate 30 with a conducting layer 20 and array of plasmonically active rods 40 that is still shown as wetted by being submerged in water 80, is now also irradiated by solar illumination 90 that excites a plasmon 96 in the rods by optical absorption. The collective electron oscillation of plasmon excitation 96 is represented in FIG. 18 by the double headed arrows shown within the plasmonically active rods 40 to symbolize the collective electron oscillations that are set up in the rods by the absorbed radiation, and, by shading around and at the rod-water interface to signify the intense electromagnetic fields and localized heat generated with the volume and at the surfaces of the rods. FIG. 18 demonstrates how local heating occurs in the plasmonically active rods in a manner more efficient than simple blackbody absorption. FIG. 19 shows the scenario from FIG. 18 shortly afterwards (picoseconds) where most of the optical energy has now been transferred from the rods 40 as heat to the water 80 resulting in the formation of localized steam bubbles 82 in the direct vicinity of the rod surfaces 40. When the steam bubbles 82 reach sufficient size buoyancy frees them from the plasmonic rod array and the steam rises to the water surface where the vapor is released. While this example shows steam generation using a planar geometry of the plasmonic energy conversion device with the AAO layer removed, the same solar steam generation can be achieved with the AAO remaining in situ as a matrix with the rods embedded within it, including by using the thread geometry of FIG. 12 alone, and, that plasmonic energy conversion device in ribbon format can be shaped into complex structures and the thread can further be woven into a plasmonically active textile or other formats.

In this embodiment, the plasmonic energy conversion device may be in the form of a ribbon, which exhibits improved characteristics for distillation, including purification or desalination of water. In practical applications, when the water is flowing through small pores, they will become clogged from particulates, or even water solutes, and as a result, nucleate within the porous structure itself. In other words, these kinds of materials are permeable. In contrast, the plasmonic energy conversion device avoids these problems. First, the embodiment of the plasmonic energy conversion device that retains the nanorods in the AAO, or other porous matrix, has a substantially planar surface, without deep interstitial penetrations. The device is comprised of a structure mounted on a non-permeable substrate. In this manner, the heating occurs along this exterior surface of the entire solid substrate of the device. The water freely cycles when steam is produced and does not have to penetrate a permeable material. In the embodiment where the AAO or other anodized oxide is etched away, there are no tubes or pores through which water must flow. Instead the water surrounds the nanorods and the steam is generated on the same side of the substrate as the nanorod structures. As a result, the nanorods are self-cleaning through ablation at the surface in that the generated steam pushes away from the nanorod structures, sometimes violently due to the high local temperature, causing water to flow in behind it. Part of the effect is the result of surface tension and part the fact that gas bubbles rise away from the substrate—that is, they tend to float. In this manner, the system continually flushes the devices so as to avoid nucleation of salt or other solutes on the plasmonically active rods and surrounding surfaces.

Figure 21:
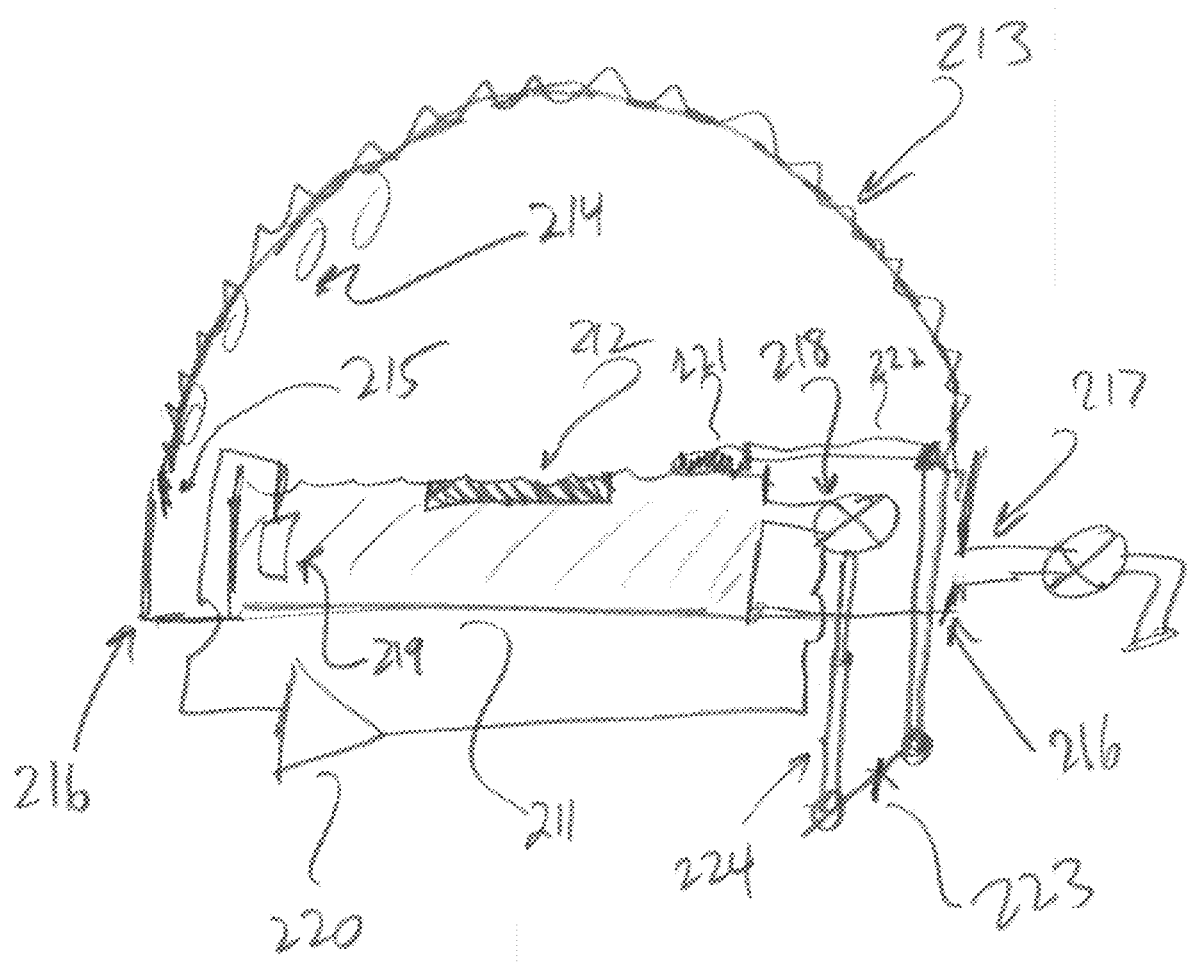
FIG. 21 shows an example solar powered water purification device that generates water vapor using the plasmonic energy conversion device.

The plasmonic energy conversion device may be used as a component in a solar-powered water purification device, including a desalination device. FIG. 21 depicts an example solar powered desalination device. The device is comprised of an incoming water basin 211, in which the plasmonic energy conversion device is wetted by being submerged in a fluid, with its active side exposed upwards toward the radiation, typically, sunlight, 212. In other embodiments, a glass slide may be used as a substrate and, being transparent, the nanowires grown on both sides. Flexible glass may be used as a substrate so that the plasmonic energy conversion device can be maneuvered into various shapes that improve the efficiency of conversion of the incoming irradiation, including sunlight. Above the incoming water basin is a transparent dome membrane, typically a glass, including a flexible glass, or plastic, that transmits solar radiation into the device, 213. Other embodiments may have a flat glass portion with vertical sides to the interior chamber instead of a dome shape. In essence, there is a chamber with some kind of wall or walls, that has a transparent region through which the sunlight is transmitted. When the water in the incoming water basin is turned into steam, the water vapor ascends and condenses into droplets on the inside the transparent membrane 214. In one embodiment, the dome is further comprised of a lensing portion that in the manner of an optical lens, concentrates incoming sunlight onto the absorbing device. As a result of gravity and surface tension, the droplets collect, and then migrate sideways and down, along the surface of the transparent dome. The lower edge of the membrane, 215, extends down over a collection trough, 216, that runs along the lower edge of the membrane. The water that collects in the trough, by being the condensate, is the purified water. In one embodiment, the trough has an outlet, 217, through which the purified water is collected. In another embodiment, the incoming water basin as an inlet valve, 218, that meters the amount of impure water that is introduced into the device. The components of the device may be formulated from plastics, including Acrylonitrile butadiene styrene (ABS). The material itself is waterproof and will form water tight surfaces when used with injection molding. Other materials that may be used are polypropylene, polycarbonate, and polyvinyl chloride, and a choice made based on their availability, durability, and temperature resistance. In one embodiment, the wetting of the plasmonic energy conversion device is achieved by it being submerged just below the surface of the fluid. In some applications, the surface of the device is submerged approximately 1 mm below the surface. In other embodiments, the device is submerged up to approximately 1 centimeter. In yet other embodiments, typically for large industrial installations, the device may be submerged up to approximately 1 meter below the surface of the fluid. With devices that have multiple substrate surfaces with plasmonically active rods, the device is submerged, but some substrates may be submerged more deeply than others. However, the device would be situated in the fluid so that the lowest substrate regions are no more than 1 meter from the surface.

Typically the incoming water flow is metered to match the outgoing water flow so that the basin does not over flow. In another embodiment, the incoming water valve, 218, is controlled in order to maintain a set level of salinity. This optimizes the operation of the device so that the rate or amount of solute nucleation on the plasmonic energy conversion device is minimized or eliminated. In one embodiment, the incoming valve may be electrically controlled and a salinity sensor, 219, placed in the incoming water basin that provides a signal representing the relative salinity of the impure water. That signal, when processed through appropriate analog and digital electronics, 220, can thereby control the amount of water introduced into the basin so that the salinity of the water in the basin is constant or below some predetermined threshold level. The circuit could be powered by a solar cell in order that the sunshine powering the water purification also powers the governing circuit. In yet another embodiment, a mechanical control of salinity may be introduced. In this embodiment, a float of a predetermined specific gravity, 221, is placed in the incoming water basin. The specific gravity of the float is selected or adjusted so that as the salinity of the water varies, the float ascends or descends. The float is attached to a first end of an arm, 222, that is comprised of two ends, that has a fulcrum between the first and second ends, and at the second end, a mechanical linkage, 223, to a valve control, 224, that controls the amount of water flowing through the valve in dependence on the position of the linkage and thereby the control. In one embodiment, the valve may adjust the flow based on the vertical position of a plunger, such that the linkage raises the plunger when the float lowers down into the impure water due to its lower salinity, while lowering the plunger and closing the valve when the float raises up.

In one embodiment of manufacturing the plasmonic energy conversion device, which may be used for solar powered water purification, the starting substrate, which may include various types of glass, is first coated with a thin conductive layer followed by an Al metal layer to produce the precursor material. The Al layer is then converted into nano-porous anodic aluminum oxide (AAO), by electrochemical anodization using the conductive layer as an electrode. The AAO is used as a template for the formation of plasmonic rod arrays and can be retained afterwards or removed. In this example, a two-step deposition is employed where one metal species and then another material are deposited sequentially to create sectioned nanorods marked. By example, one material is silver and the other a thin gold layer capping the silver to avoid environmental exposure as the gold-capped-silver rods remain encased in transparent AAO providing a resilient protective coating. Alternatively, the AAO may be removed using a chemical etch leaving a free-standing plasmonically active rod array attached to the substrate. Plasmonic rod arrays can be produced on one or both sides of the substrate.

Figure 22:
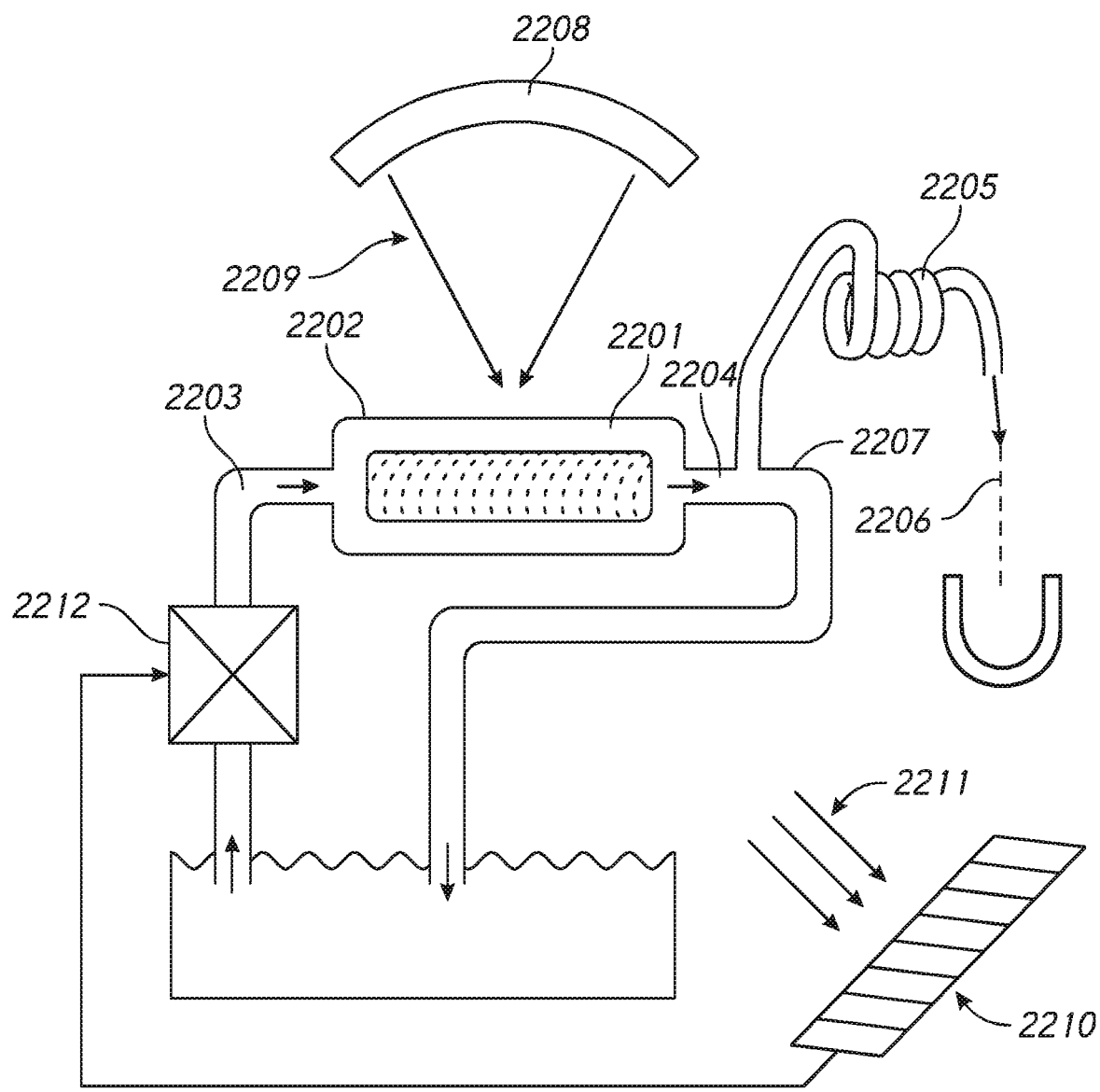
FIG. 22 shows another example of a solar powered water purification device utilizing the plasmonic energy conversion device.

In yet another embodiment a solar powered vapor generating system can utilize the plasmonic energy conversion device as shown in FIG. 22. In this embodiment, the device can be comprised of at least one surface of a substrate, or alternatively a cylindrical substrate as in FIG. 12, with plasmonically active rods situated along the surface. The entire plasmonic energy conversion device (2201) can then be situated within a hollow reaction tube (2202) comprised of a transparent material. In this embodiment, the fluid wets the device by the impure water flowing into a first end of the reaction tube, (2203) while steam, which may be mixed with water, emerges from a second end of the reaction tube (2204). The steam can be separated from any water and collected in a condensing device, (2205) with pure water emerging from the condensing device (2206). The condensing device may be a condensing coil tube connected to a manifold that permits the steam to enter the condensing tube while routing any water away, to be either discarded or recycled back into the heating tube. In another embodiment, instead of a condensing coil tube, the manifold (2207) can route the steam-water mixture into a chamber that has a condensing surface that collects the purified water, while the water remains in a basin. In one variation of the embodiment, the reaction tube containing the plasmonic energy conversion device is situated vertically so that the steam lifts up and away from the tube into the condensing device. In some embodiments, lenses or mirrors (2208) may be included in the vapor generating system that concentrate the irradiation of solar light (2209) onto the reaction tube containing the plasmonic energy conversion device (2202). In addition, the vapor generating system can include photovoltaic cells (2210) that generate electricity from the sunlight (2211) that is used to power water pumps (2212) that circulate impure water through the reaction tube. Further, the flow rate of the impure water through the irradiated reaction tube can be adjusted so that the plasmonic energy conversion device is maintained at a temperature below its melting point despite the concentrated solar energy that it is irradiated with.

While the foregoing written description of the invention enables one of ordinary skill to make and use what is considered presently to be the best mode thereof, those of ordinary skill will understand and appreciate the existence of variations, combinations, and equivalents of the specific embodiments, methods, and examples herein. The invention should therefore not be limited by the above described embodiment, method, and examples, but by all embodiments and methods within the scope and spirit of the invention.

The invention claimed is:

1. A method of generating vapor from a fluid comprising: wetting a plasmonic energy conversion device with the fluid, said plasmonic energy conversion device being non-permeable and comprised of an insulating matrix with a first and a second opposing surfaces, with a plurality of electrically conductive plasmonically active rods embedded in the matrix, said rods having a first and a second end, the second surface of the matrix and the second end of the plasmonically active rods attached to a conductive substrate layer and the first end of the plasmonically active rods being approximately at or below the first surface of the matrix; and irradiating the wetted plasmonic energy conversion device, where the plurality of electrically conductive plasmonically active rods have a distribution of lengths over a predetermined range, wherein either the plurality of electrically conductive plasmonically active rods have a gradient in length whereby there is a transition from the shortest rods in the range of lengths to the longest rods in the range of lengths across at least one region on a surface of the device, or the plurality of electrically conductive plasmonically active rods have a distribution in the range of lengths that is dispersed randomly across a surface of the conductive substrate layer.

2. The method of claim 1 where the plasmonically active rods are comprised of one of silver, gold, aluminum, copper, cobalt, chromium, iron, molybdenum, manganese, indium, nickel, palladium, platinum, rhodium, tantalum, titanium, titanium nitride, tungsten, silicon, tin, zirconium nitride, zinc, iridium.

3. The method of claim 1 where the matrix is Aluminum Oxide.

4. The method of claim 1 where the matrix is one of Titanium Dioxide, Magnesium Oxide, Niobium Oxide, Tin Oxide, Cobalt Oxide, Iron Sulfide, Cobalt Sulfide, Nickel Sulfide, Tungsten Carbide, or Molybdenum Carbide.

5. The method of claim 1 where the electrically conductive plasmonically active rods are comprised of a first and second region, where the first and second regions are different materials.

6. The method of claim 1 where the range of length is between approximately 20 nanometers to 2 micrometers.

7. The method of claim 1 where the range of length is between approximately 50 nanometers to 500 nanometers.

8. The method of claim 1 where the diameter of the plurality of electrically conductive plasmonically active rods is consistent.

9. The method of claim 1 where the plurality of electrically conductive plasmonically active rods have a distribution of diameters over a predetermined range.

10. The method of claim 9 where the range of diameters is between approximately 20 nanometers to 900 nanometers.

11. The method of claim 9 where the range of diameters is between approximately 30 nanometers to 250 nanometers.

12. The method of claim 1 where the radiation has an effective spectral width and the predetermined range of lengths correspond to the effective spectral width.

13. The method of claim 9 where the radiation has an effective spectral width and the predetermined range of diameters correspond to the effective spectral width.

14. The method of claim 1 where the conductive substrate layer is one of: silver, gold, aluminum, tungsten, nickel, palladium, cobalt, molybdenum, platinum, copper, zinc, iron iridium.

15. The method of claim 1 where the plasmonic energy conversion device is fully submerged in the fluid, but the highest first ends of the plurality of the plasmonically active rods are situated just below the surface of the fluid.

16. The method of claim 1 where the plasmonic energy conversion device is fully submerged in the fluid, but the highest first ends of the plurality of the plasmonically active rods are situated approximately 1 mm below the surface of the fluid.

17. The method of claim 1 where the plasmonic energy conversion device is fully submerged in the fluid, but the highest first ends of the plurality of the plasmonically active rods are situated no more than approximately 1 centimeter below the surface of the fluid.

18. The method of claim 1 where the plasmonic energy conversion device is fully submerged in the fluid, but the highest first ends of the plurality of the plasmonically active rods are situated no more than approximately 1 meter below the surface of the fluid.

19. The method of claim 1 where the plasmonic energy conversion device is fully submerged in the fluid and is comprised of at least two substrate regions located at two different depths in the fluid and the lower substrate is no more than approximately 1 meter below the surface of the fluid.

20. The method of claim 1 where the plasmonically active rods are comprised of one of alloys, oxides, or nitrides of one of silver, gold, aluminum, copper, cobalt, chromium, iron, molybdenum, manganese, indium, nickel, palladium, platinum, rhodium, tantalum, titanium, titanium nitride, tungsten, silicon, tin, zirconium nitride, zinc, or iridium.

21. The method of claim 1 where the conductive substrate layer is a transparent conductive oxide.

22. The method of claim 21 where the transparent conductive oxides is one of:
indium tin oxide (ITO), aluminum-doped zinc oxide (AZO).

23. The method of claim 1 where the conductive substrate layer is a conducting polymer.

24. The method of claim 23 where the conducting polymer is PEDOT.

25. The method of claim 1 where the conductive substrate layer is comprised of a graphene molecular structure.

26. The method of claim 25 where the graphene molecular structure is a fullerene.

27. The method of claim 25 where the graphene molecular structure is a carbon nanotube.

28. The method of claim 1 where the conductive substrate layer is situated on an outer surface of a continuous substrate material, said continuous substrate material one of a glass, a ribbon, a foil, a thread, a fiber, a polymer.

29. The method of claim 28 where the glass continuous substrate material is a flexible glass.

30. The method of claim 28 where the polymer continuous substrate material is one of Kapton or Tedlar.

31. The method of claim 28 where the foil continuous substrate material is metallic.

32. The method of claim 28 where the plasmonic energy conversion device utilizes the thread format for the substrate and said thread is woven into a textile.

33. The method of claim 1 where the plasmonic energy conversion device is inserted into a tube through which the fluid passes.

34. A method of generating vapor from a fluid comprising: wetting a plasmonic energy conversion device with the fluid, said plasmonic energy conversion device being comprised of a plurality of electrically conductive plasmonically active rods, said rods having a first and a second end, the second end of the plasmonically active rods being attached to a conductive substrate layer and there being no insulating matrix surrounding the rods; and irradiating the wetted plasmonic energy conversion device, where the plurality of electrically conductive plasmonically active rods has a distribution of lengths over a predetermined range, wherein either the plurality of electrically conductive plasmonically active rods have a gradient in length whereby there is a transition from the shortest rods in the range of lengths to the longest rods in the range of lengths across at least one region on a surface of the device, or the plurality of electrically conductive plasmonically active rods have a distribution in the range of lengths that is dispersed randomly across a surface of the conductive substrate layer.

35. The method of claim 34 where the plasmonically active rods are comprised of one of silver, gold, aluminum, copper, cobalt, chromium, iron, molybdenum, manganese, indium, nickel, palladium, platinum, rhodium, tantalum, titanium, titanium nitride, tungsten, silicon, tin, zirconium nitride, zinc, iridium.

36. The method of claim 34 where the plasmonically active rods are comprised of one of alloys, oxides, or nitrides of one of silver, gold, aluminum, copper, cobalt, chromium, iron, molybdenum, manganese, indium, nickel, palladium, platinum, rhodium, tantalum, titanium, titanium nitride, tungsten, silicon, tin, zirconium nitride, zinc, or iridium.

37. The method of claim 34 where the conductive substrate layer is a transparent conductive oxide.

38. The method of claim 37 where the transparent conductive oxides is one of:
indium tin oxide (ITO), aluminum-doped zinc oxide (AZO).

39. The method of claim 34 where the conductive substrate layer is a conducting polymer.

40. The method of claim 39 where the conducting polymer is PEDOT.

41. The method of claim 34 where the conductive substrate layer is comprised of a graphene molecular structure.

42. The method of claim 41 where the graphene molecular structure is a fullerene.

43. The method of claim 41 where the graphene molecular structure is a carbon nanotube.

44. The method of claim 34 where the conductive substrate layer is situated on an outer surface of a continuous substrate material, said continuous substrate material one of a glass, a ribbon, a foil, a thread, a fiber, a polymer.

45. The method of claim 44 where the glass continuous substrate material is a flexible glass.

46. The method of claim 44 where the polymer continuous substrate material is one of Kapton or Tedlar.

47. The method of claim 44 where the foil continuous substrate material is metallic.

48. The method of claim 34 where the matrix is Aluminum Oxide.

49. The method of claim 34 where the matrix is one of Titanium Dioxide, Magnesium Oxide, Niobium Oxide, Tin Oxide, Cobalt Oxide, Iron Sulfide, Cobalt Sulfide, Nickel Sulfide, Tungsten Carbide, or Molybdenum Carbide.

50. The method of claim 34 where the electrically conductive plasmonically active rods are comprised of a first and second region, where the first and second regions are different materials.

51. The method of claim 34 where the range of length is between approximately 20 nanometers to 2 micrometers.

52. The method of claim 34 where the range of length is between approximately 50 nanometers to 500 nanometers.

53. The method of claim 34 where the diameter of the plurality of electrically conductive plasmonically active rods is consistent.

54. The method of claim 34 where the plurality of electrically conductive plasmonically active rods have a range of diameters distributed over a predetermined range.

55. The method of claim 54 where the range of diameters is between approximately 20 nanometers to 900 nanometers.

56. The method of claim 54 where the range of diameters is between approximately 30 nanometers to 250 nanometers.

57. The method of claim 34 where the radiation has an effective spectral width and the predetermined range of lengths correspond to the effective spectral width.

58. The method of claim 54 where the radiation has an effective spectral width and the predetermined range of diameters correspond to the effective spectral width.

59. The method of claim 34 where the conductive substrate layer is one of: silver, gold, aluminum, tungsten, nickel, palladium, cobalt, molybdenum, platinum, copper, zinc, iron iridium.

60. The method of claim 34 where the plasmonic energy conversion device is fully submerged in the fluid, but the highest first ends of the plurality of the plasmonically active rods are situated just below the surface of the fluid.

61. The method of claim 34 where the plasmonic energy conversion device is fully submerged in the fluid, but the highest first ends of the plurality of the plasmonically active rods are situated approximately 1 mm below the surface of the fluid.

62. The method of claim 34 where the plasmonic energy conversion device is fully submerged in the fluid but the highest first ends of the plurality of the plasmonically active rods are situated no more than approximately 1 centimeter below the surface of the fluid.

63. The method of claim 34 where the plasmonic energy conversion device is fully submerged in the fluid, but the highest first ends of the plurality of the plasmonically active rods are situated no more than approximately 1 meter below the surface of the fluid.

64. The method of claim 34 where the plasmonic energy conversion device is fully submerged in the fluid, and comprised of at least two substrate regions located at two different depths in the fluid and the lower substrate is no more than approximately 1 meter below the surface of the fluid.

65. The method of claim 44 where the plasmonic energy conversion device utilizes the thread format for the substrate and said thread is woven into a textile.

66. The method of claim 34 where the plasmonic energy conversion device is inserted into a tube through which the fluid passes.

* * * * *